United States Patent
Aoki

(10) Patent No.: US 7,030,494 B2
(45) Date of Patent: Apr. 18, 2006

(54) SEMICONDUCTOR PACKAGE HAVING BUILT-IN MICRO ELECTRIC MECHANICAL SYSTEM AND MANUFACTURING METHOD THEREOF

(75) Inventor: Yutaka Aoki, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/874,913

(22) Filed: Jun. 22, 2004

(65) Prior Publication Data

US 2004/0262716 A1    Dec. 30, 2004

(30) Foreign Application Priority Data

Jun. 30, 2003    (JP) ............................... 2003-186961

(51) Int. Cl.
  H01L 29/40    (2006.01)
  H01L 21/00    (2006.01)
(52) U.S. Cl. ..................... 257/758; 257/704; 257/415; 257/686; 257/684; 257/678; 438/51; 438/455; 438/459; 438/125; 438/106
(58) Field of Classification Search .......... 438/113, 438/122, 50, 53, 459, 756, 458, 51, 455; 257/758, 759, 760, 774, 619, 704, 415
  See application file for complete search history.

(56) References Cited

U.S. PATENT DOCUMENTS

| 6,559,530 B1* | 5/2003 | Hinzel et al. ............... 257/684 |
| 6,596,624 B1* | 7/2003 | Romankiw ................... 438/619 |
| 6,746,898 B1* | 6/2004 | Lin et al. ..................... 438/113 |
| 6,828,172 B1* | 12/2004 | Chavan et al. ................ 438/50 |
| 6,861,754 B1* | 3/2005 | Lin et al. ..................... 257/758 |
| 6,888,209 B1* | 5/2005 | Jobetto ........................ 257/459 |
| 2003/0047799 A1* | 3/2003 | Cheever et al. ............. 257/686 |
| 2004/0150104 A1* | 8/2004 | Terui ........................... 257/734 |
| 2004/0222508 A1* | 11/2004 | Aoyagi ........................ 257/686 |
| 2004/0262645 A1* | 12/2004 | Huff et al. ................... 257/232 |

FOREIGN PATENT DOCUMENTS

JP    2002-057291 A    2/2002

* cited by examiner

Primary Examiner—B. William Baumeister
Assistant Examiner—Igwe U. Anya
(74) Attorney, Agent, or Firm—Frishauf, Holtz, Goodman & Chick, P.C.

(57) ABSTRACT

A semiconductor package includes a semiconductor structure having a plurality of electrodes for external connection which are provided on a semiconductor substrate, an insulation layer provided on the semiconductor structure, an upper wiring having connection pad portions and provided on the insulation layer such that at least parts of the upper wiring are connected to the electrodes for external connection of the semiconductor structure, a micro electric mechanical system electrically connected to parts of the connection pad portions of the upper wiring, pole electrodes provided so as to be electrically connected to other connection pad portions of the upper wiring, and an upper insulation film covering the vicinities of the pole electrodes and at least the vicinity of the micro electric mechanical system.

20 Claims, 24 Drawing Sheets

SEMICONDUCTOR PACKAGE HAVING BUILT-IN MICRO ELECTRIC MECHANICAL SYSTEM AND MANUFACTURING METHOD THEREOF

BACKGROUND OF THE INVENTION

1. Field of the Invention

The present invention relates to a semiconductor package having a built-in Micro Electric Mechanical System, and to a manufacturing method thereof.

2. Description of the Related Art

Conventionally, as disclosed in Unexamined Japanese Patent Application KOKAI Publication No. 2002-57291, there is such a semiconductor package in which on a semiconductor substrate, a first conductive layer, a dielectric layer, and a second conductive layer are stacked to form a three-dimensional capacitor element, a pole electrode is formed on the capacitor element, and the pole electrode including the capacitor element is covered with a sealing film. Since this semiconductor package has the three-dimensional capacitor element formed on the semiconductor substrate, the package can be miniaturized as a whole, as compared with a case where the three-dimensional capacitor element is mounted on a circuit board.

Recently, MEMS (Micro Electric Mechanical System) components such as a minute and three-dimensional acceleration sensor, etc. have been developed by utilizing miniaturization technologies accumulated in semiconductor manufacture technologies. Since such an MEMS component is not a component integral with a semiconductor package, use of the MEMS component enlarges the mounting area and cannot miniaturize the semiconductor package as a whole.

SUMMARY OF THE INVENTION

Therefore, an object of the present invention is to provide a semiconductor package which can be mounted with an MEMS component and at the same time can be miniaturized, and a manufacturing method thereof.

To achieve the above object, a semiconductor package according to a first aspect of the present invention comprises: a semiconductor structure having a plurality of electrodes for external connection which are provided on a semiconductor substrate; an insulation layer provided on the semiconductor structure; an upper wiring having connection pad portions and provided on the insulation layer in a manner that at least a art thereof is connected to the electrodes for external connection of the semiconductor structure; a micro electric mechanical system electrically connected to parts of the connection pad portions of the upper wiring; pole electrodes provided so as to be electrically connected to other parts of the connection pad potions of the upper wiring; and an upper insulation film covering vicinities of the pole electrodes, and at least a vicinity of the micro electric mechanical system.

To achieve the above object, a manufacturing method for a semiconductor package according to a second aspect of the present invention comprises: a step of arranging on a base plate, apart from each other, a plurality of semiconductor structures each having a plurality of electrodes for external connection which are provided on a semiconductor substrate; a step of forming an insulation layer on the semiconductor structures and the base plate; a step of forming an upper wiring having connection pad portions on the insulation layer, in a manner that at least parts of the upper wiring are connected to the electrodes for external connection of the semiconductor structures; a step of arranging a micro electric mechanical system which is to be electrically connected to parts of the connection pad portions of the upper wiring; a step of forming pole electrodes which are to be electrically connected to other connection pad portions of the upper wiring; a step of covering vicinities of the pole electrodes and at least a vicinity of the micro electric mechanical system with an upper insulation film; and a step of obtaining a plurality of semiconductor packages including the micro electric mechanical system by dividing the upper insulation film, the insulation layer, and the base plate between the semiconductor structures.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS (First Embodiment)

Figure 1:
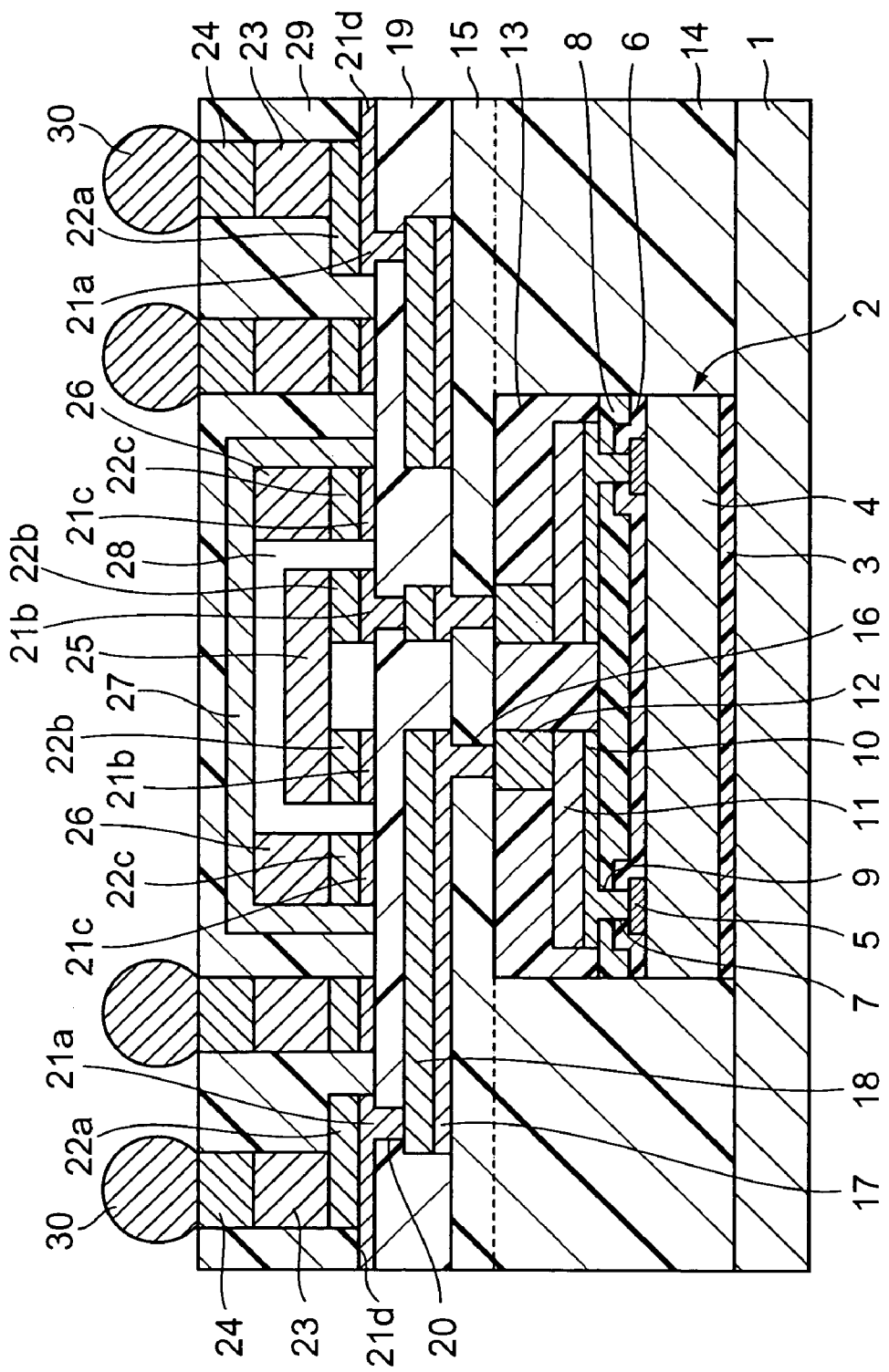
FIG. 1 is an enlarged cross sectional view of a semiconductor package as a first embodiment of the present invention.

FIG. 1 is a cross-sectional view of a semiconductor package as a first embodiment of the present invention. This semiconductor package comprises a planar rectangular base plate 1 made of silicon, glass, ceramics, resin, metal, or the like. The lower surface of a planar rectangular semiconductor structure 2 having a size smaller to some degree than that of the base plate 1 is adhered to the central region of the upper surface of the base plate 1 by an adhesive layer 3 made of a die-bonding material.

The semiconductor structure 2 comprises wirings, pole electrodes, and sealing films which are described later, and is generally called a CSP (Chip Size Package). In particular, the semiconductor structure 2 is also called a wafer level CSP (W-CSP) because, as will be described later, the semiconductor structure 2 is manufactured in a manner that wirings, pole electrodes, and sealing films are formed on a silicon wafer, and each unit semiconductor structure 2 is obtained from the silicon wafer by dicing. The configuration of the semiconductor structure 2 will now be described below.

The semiconductor structure 2 comprises a silicon substrate (semiconductor substrate) 4. The silicon substrate 4 is adhered to the base plate 1 by the adhesive layer 3. An integrated circuit (not illustrated) having a specific function is arranged on the central region of the upper surface of the silicon substrate 4. A plurality of connection pads 5 made of aluminous metal or the like are arranged on the peripheral region of the upper surface of the silicon substrate 4 so as to be connected to the integrated circuit. An insulation film 6 made of silicon oxide or the like is provided on the upper surface of the silicon substrate 4 except the central regions of the connection pads 5. The central regions of the connection pads 5 are exposed via openings 7 provided in the insulation film 6.

A protection film (insulation film) 8 made of epoxy resin, polyimide resin, or the like is provided on the upper surface of the insulation film 6. Openings 9 are provided in the protection film 8 at locations overlapping the openings 7 of the insulation film 6. Base metal layers 10 made of copper or the like are provided at predetermined locations of the upper surface of the protection film 8 so as to be connected to the connection pads 5 via the openings 7 and the openings 9. Wirings 11 made of copper are provided on the entire upper surfaces of the base metal layers 10.

Pole electrodes (electrodes for external connection) 12 made of copper are provided on the upper surfaces of the connection pad portions of the wirings 11. A sealing film (insulation film) 13 made of epoxy resin, polyimide resin, or the like is provided over the upper surface of the protection film 8 and the wirings 11, such that the upper surface of the sealing film 13 becomes level with the upper surfaces of the pole electrodes 12. As described above, the semiconductor structure 2 called a W-CSP is configured by including the silicon substrate 4, the connection pads 5, and the insulation film 6, and further the protection film 8, the wirings 11, the pole electrodes 12, and the sealing film 13.

A rectangular-frame-shaped insulation layer 14 made of epoxy resin, polyimide resin, or the like is provided on the upper surface of the base plate 1 around the semiconductor structure 2. A first upper insulation film 15 is provided on the upper surfaces of the semiconductor structure 2 and insulation layer 14, such that the upper surface of the first upper insulation film 15 becomes flat. As will be described later, the first upper insulation film 15 is formed simultaneously with the formation of the insulation layer 14 using the same material as the insulation layer 14. Openings 16 are provided in the first upper insulation film 15 at locations corresponding to (overlapping) the central regions of the upper surfaces of the pole electrodes 12.

A first upper base metal layer 17 made of copper or the like is provided at predetermined locations of the upper surface of the first upper insulation film 15 so as to be connected to the pole electrodes 12 via the openings 16. A first upper wiring 18 made of copper is provided on the entire upper surface of the first upper base metal layer 17. A second upper insulation film 19 made of epoxy resin, polyimide resin, or the like is provided on the upper surface of the first upper insulation film 15 and the first upper wiring 18. The upper surface of the second upper insulation film 19 is formed flat. Openings 20 are provided in the second upper insulation film 19 at locations corresponding to (overlapping) the connection pad portions of the first upper wiring 18.

Second upper base metal layers 21a and 21b, dummy base metal layers 21c, and connector base metal layers 21d which are made of copper or the like are provided at predetermined locations of the upper surface of the second upper insulation film 19. Second upper wirings 22a and 22b made of copper are provided on the entire upper surfaces of the second upper base metal layers 21a and 21b. At least some portions of the second upper base metal layers 21a and 21b including the second upper wirings 22a and 22b are connected to the connection pad portions of the first upper wiring 18 via the openings 20. Dummy wirings 22c made of copper are provided on the entire upper surfaces of the dummy base metal layers 21c.

The connection pad portions of the second upper wirings 22a including the second upper base metal layers 21a are arranged at the peripheral regions of the upper surface of the second upper insulation film 19. Lower pole electrodes 23 and upper pole electrodes 24 which are made of copper are provided on the upper surfaces of the second upper wirings 22a. The connector base metal layers 21d are connected to the second upper base metal layers 21a. The connector base metal layers 21d extend to the end surfaces of the second upper insulation film 19. The function of the connector base metal layers 21d will be described later.

The connection pad portions of the second upper wirings 22b including the second upper base metal layers 21b are arranged at the central region of the upper surface of the second upper insulation film 19. An MEMS component 25 constituted by a minute and three-dimensional acceleration sensor or the like manufactured by a micro machine technology is mounted on the upper surfaces of the second upper wirings 22b. Electrodes of the MEMS component 25 are connected to the upper surfaces of the connection pad portions of the second upper wirings 22b by solder (not illustrated).

The dummy wirings 22c including the dummy base metal layers 21c are insular, and arranged at four locations around the region where the MEMS component 25 is mounted. Dummy pole electrodes 26 made of copper are provided upon the upper surfaces of the dummy wirings 22c. A rectangular cylindrical protection cover 27 that is capped at one end and made of resin, metal, or the like is arranged by being positioned along the outer side surfaces and upper surfaces of the dummy pole electrodes 26 including the dummy base metal layers 21c and dummy wirings 22c. A space 28 for allowing the HEMS component 25 to be driven is provided between the protection cover 27 and the MEMS component 25.

The planar shape of the lower pole electrodes 23 and upper pole electrodes 24 is circular. The planar shape of the dummy pole electrodes 26 is not limited to a circular shape, but may be a rectangular shape, an almost L-letter shape, or the like, because the dummy pole electrodes 26 are for positioning the protection cover 27. The height of the lower pole electrodes 23 is almost the same as that of the dummy pole electrodes 26. The total of the heights of the lower pole electrode 23 and upper pole electrode 24 is a little larger than the total of the height of the dummy pole electrode 26 and the thickness of the upper plate of the protection cover 27.

A third upper insulation film (sealing film) 29 made of epoxy resin, polyimide resin, or the like is formed on the upper surface of the second upper insulation film 19 including the protection cover 27, etc. around the lower pole electrodes 23 and upper pole electrodes 24. The upper surface of the third upper insulation film 29 becomes level with the upper surfaces of the upper pole electrodes 24. Solder balls 30 are provided on the upper surfaces of the upper pole electrodes 24 that are exposed from the third upper insulation film 29.

As described above, in this semiconductor package, the MEMS component 25 is covered with the protection cover 27 in a manner that the MEMS component 25 can be driven. Further, the surface of the protection cover 27 is covered with the third upper insulation film 29. As a result, it is possible to drivably mount the MEMS component 25 and at the same time miniaturize the whole package.

Figure 2:
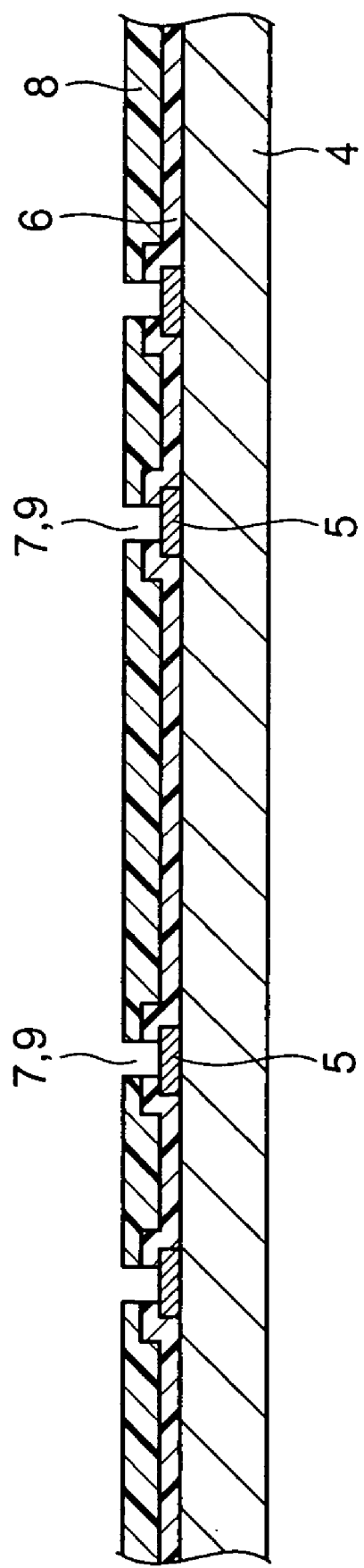
FIG. 2 is a cross sectional view of components initially prepared in one example of a manufacturing method for the semiconductor package shown in FIG. 1.

Next, one example of a manufacturing method of this semiconductor package will be explained. First, one example of a manufacturing method of the semiconductor structure 2 will be explained. First, as shown in FIG. 2, a wafer silicon substrate (semiconductor substrate) 4 is prepared on which connection pads 5 made of aluminous metal, an insulation film 6 made of silicon oxide or the like, and a protection film 8 made of epoxy resin, polyimide resin, or the like are formed wherein the central regions of the connection pads 5 are exposed via openings 7 and openings 9 respectively formed in the insulation film 6 and protection film 8. Integrated circuits having a predetermined function are formed on the regions of the wafer silicon substrate 4 on which individual semiconductor structures are to be mounted. Each connection pad 5 is electrically connected to the predetermined terminal formed in the integrated circuit formed on the corresponding region.

Figure 3:
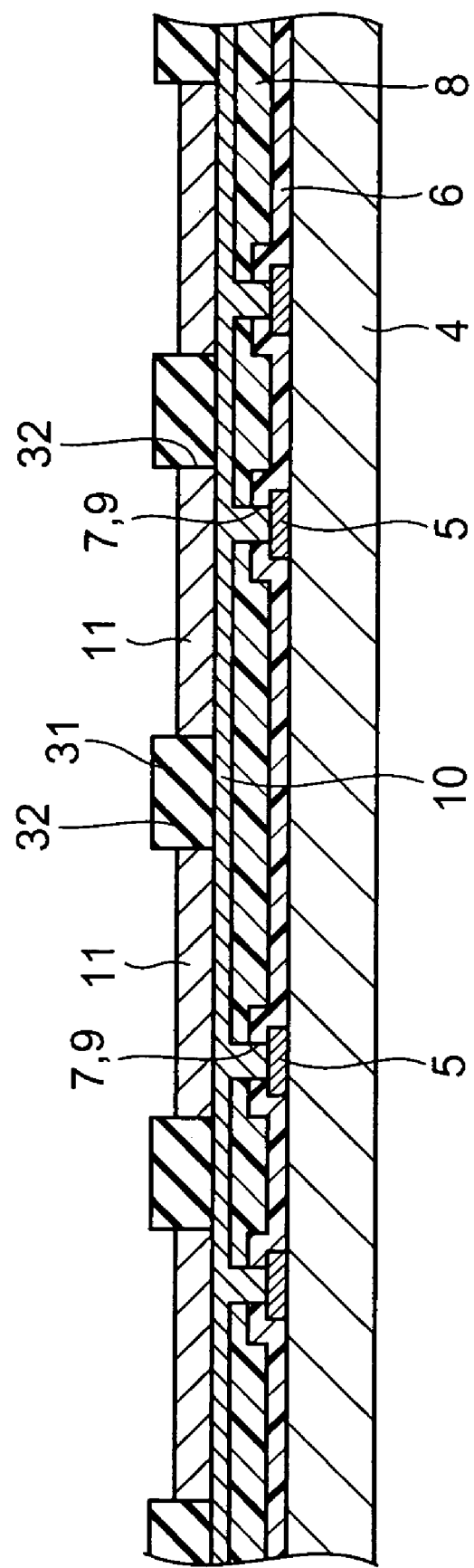
FIG. 3 is an enlarged cross sectional view for explaining a step succeeding FIG. 2.

Next, as shown in FIG. 3, a base metal layer 10 is formed on the entire upper surface of the protection film 8 including the upper surfaces of the connection pads 5 exposed via the openings 7 and openings 9. In this case, the base metal layer 10 may be entirely formed of a single copper layer by electroless plating or sputtering or formed of a dual-layer including thin film layers of titanium or the like and a copper layer thereon by sputtering. This kind of formation also applies to the first upper base metal layer 17 and the second upper base metal layers 21 which are to be described later.

Next, a resist film 31 for preventing a plate is formed on the upper surface of the base metal layer 10 to have a pattern. In this case, openings 32 are formed in the resist film 31 at locations corresponding to the regions where wirings 11 are to be formed. Next, by applying electrolytic plating of copper, wirings 11 are formed on the upper surface of the base metal layer 10 within the openings 32 of the resist film 31 through the base metal layer 10 as the plating current path. Then, the resist film 31 is peeled off.

Figure 4:
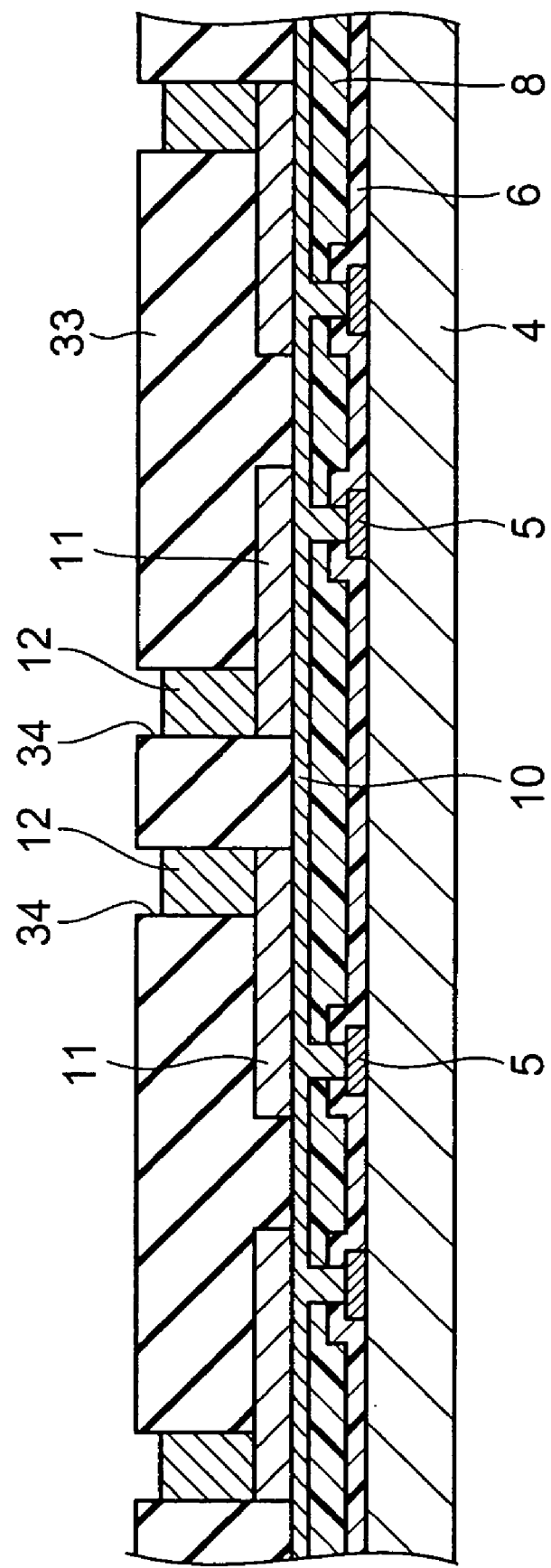
FIG. 4 is an enlarged cross sectional view for explaining a step succeeding FIG. 3.
Figure 5:
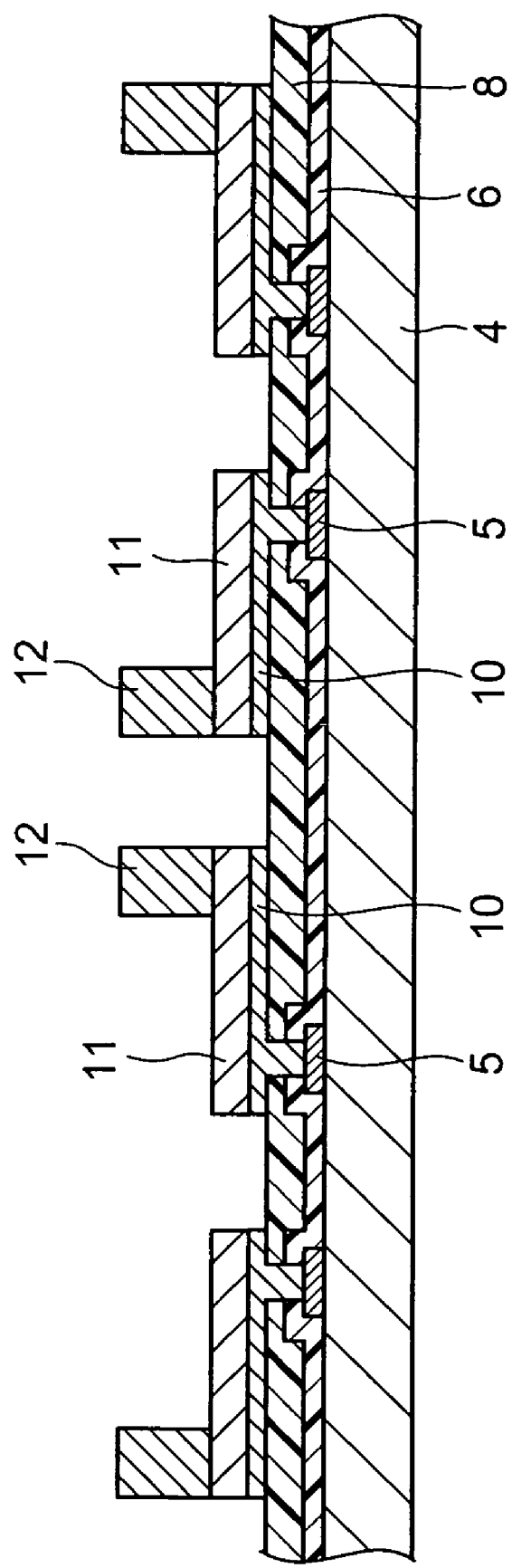
FIG. 5 is an enlarged cross sectional view for explaining a step succeeding FIG. 4.

Next, as shown in FIG. 4, a resist film 33 for preventing a plate is formed on the upper surface of the base metal layer 10 including the wirings 11 so as to have a pattern. In this case, openings 34 are formed in the resist film 33 at locations corresponding to the regions where pole electrodes 12 are to be formed. Next, by applying electrolytic plating of copper, pole electrodes 12 are formed on the upper surfaces of the connection ad portions of the wirings 11 within the openings 34 of the resist film 33 through the base metal layer 10 as the plating current path. Then, the resist film 33 is peeled off, and unnecessary portions of the base metal layer 10 are removed by etching with the pole electrodes 12 and wirings 11 as masks. As a result, the base metal layer 10 remains only beneath the wirings 11, as shown in FIG. 5.

Figure 6:
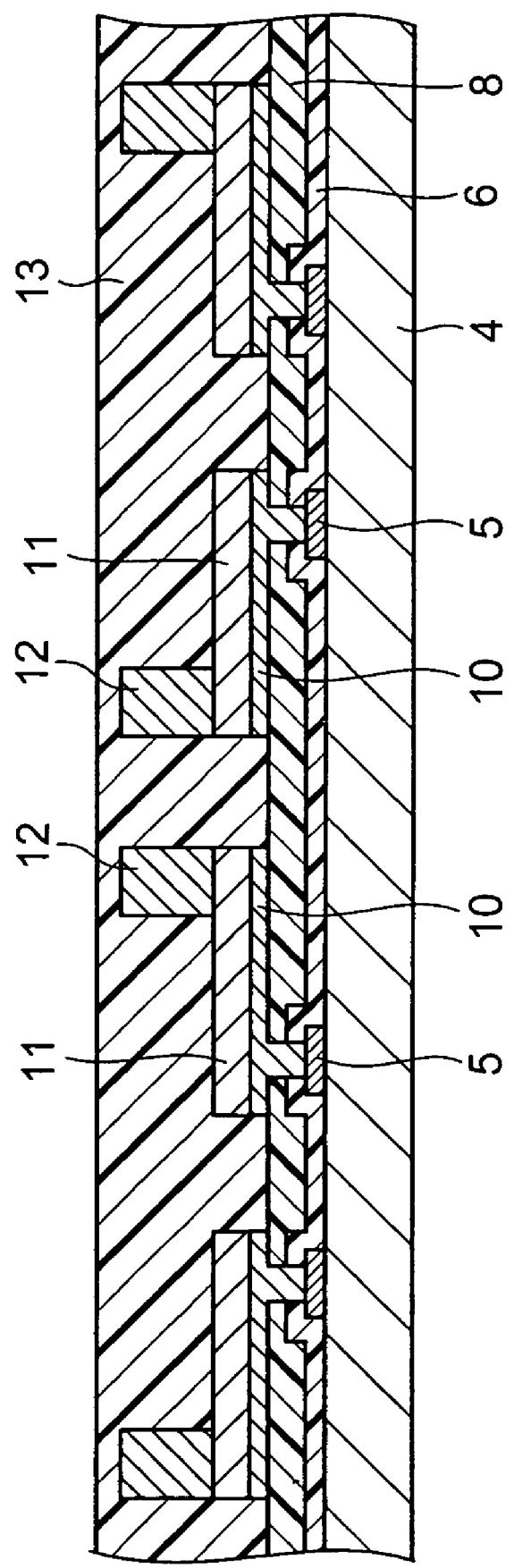
FIG. 6 is an enlarged cross sectional view for explaining a step succeeding FIG. 5.

Next, as shown in FIG. 6, a sealing film 13 made of epoxy resin, polyimide resin, or the like is formed by a printing method, a molding method, or the like upon the entire upper surface of the protection film 8 including the pole electrodes 12 and the wirings 11. The sealing film 13 is formed to have a thickness larger than the height of the pole electrodes 12. Therefore, in this state, the upper surfaces of the pole electrodes 12 are entirely covered with the sealing film 13.

Figure 7:
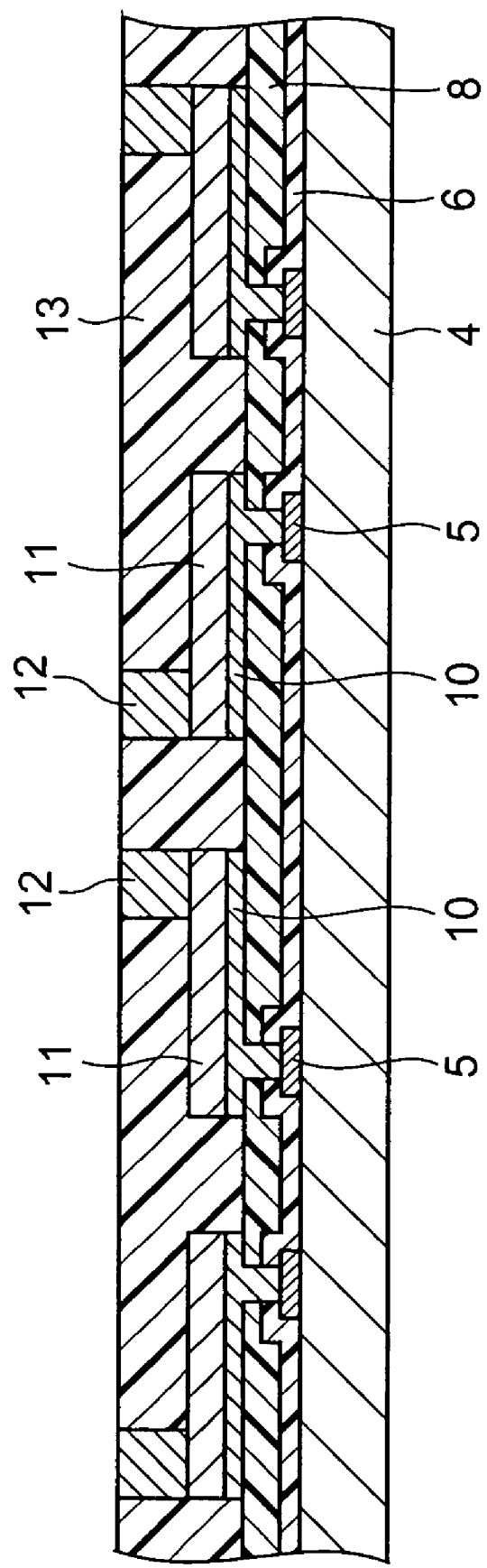
FIG. 7 is an enlarged cross sectional view for explaining a step succeeding FIG. 6.

Then, the upper surfaces of the sealing film 13 and pole electrodes 12 are adequately polished to expose the upper surfaces of the pole electrodes 12 and flatten the upper surface of the sealing film 13 including the exposed upper surfaces of the pole electrodes 12, as shown in FIG. 7. The pole electrodes 12 formed by electrolytic plating are uneven in height, but the upper surfaces of the pole electrodes 12 are adequately polished in this step, thereby removing the unevenness and making the height of the pole electrodes 12 uniform. This step will be applied to the lower and upper pole electrodes 23 and 24 to be described later, for the same reason.

Figure 8:
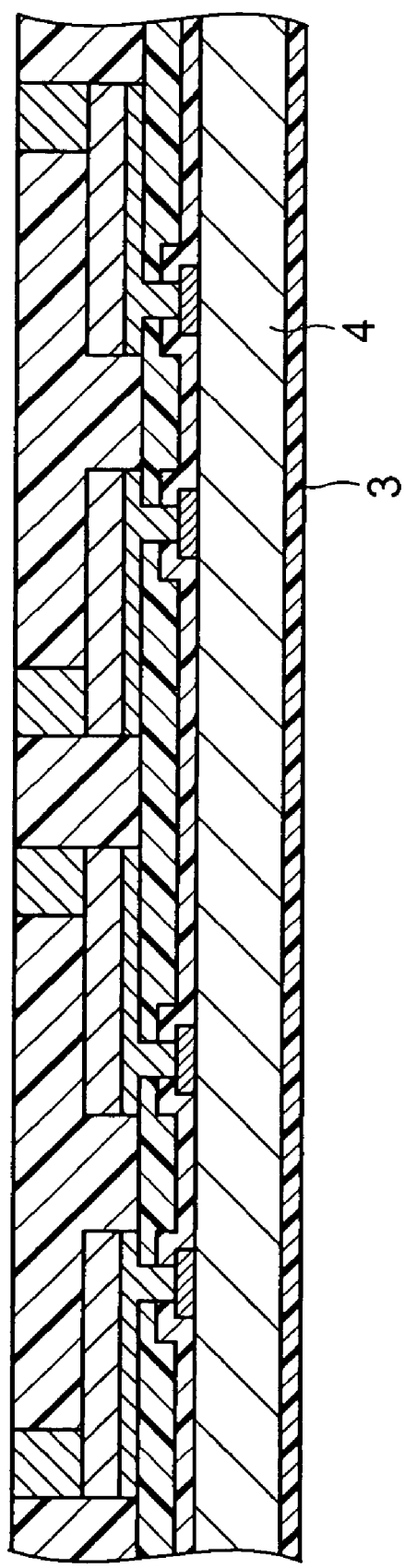
FIG. 8 is an enlarged cross sectional view for explaining a step succeeding FIG. 7.
Figure 9:
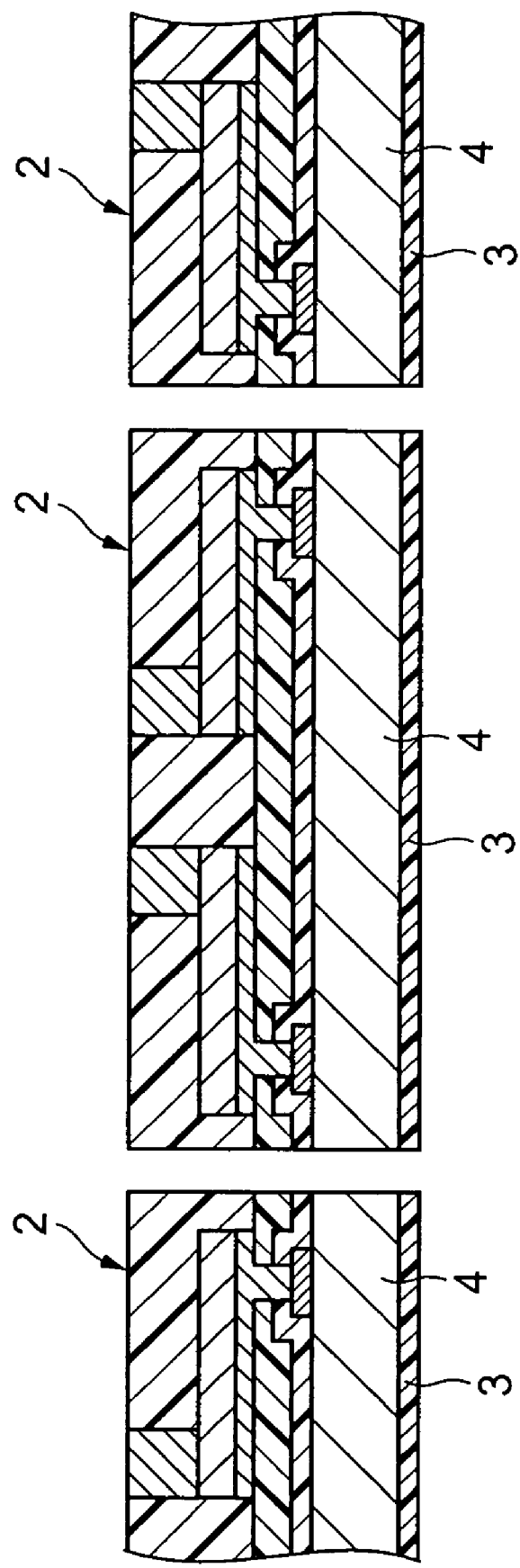
FIG. 9 is an enlarged cross sectional view for explaining a step succeeding FIG. 8.

Next, as shown in FIG. 8, an adhesive layer 3 is adhered to the entire lower surface of the silicon substrate 4. The adhesive layer 3 is made of a die bonding material of epoxy resin, polyimide resin, or the like. The adhesive layer 3 is fixed onto the silicon substrate 4, while the adhesive layer 3 is semi-hardened by hot pressing. Next, the adhesive layer 3 fixed onto the silicon substrate 4 is adhered to a dicing tape (not illustrated) to perform a dicing step. When the adhesive layer 3 is separated from the dicing tape after the dicing step, a plurality of semiconductor structures 2 having the adhesive layer 3 under the lower surface of the silicon substrate 4 are obtained.

Since the semiconductor structure 2 obtained in this manner has the adhesive layer 3 under the lower surface of the silicon substrate 4, the extremely bothersome work of providing an adhesive layer to the lower surface of the silicon substrate 4 of each semiconductor structure 2 is unnecessary after the dicing step. The work of separating the adhesive layer 3 from the dicing tape after the dicing step is much easier than the work of providing an adhesive layer to the lower surface of the silicon substrate 4 of each semiconductor structure 2 after the dicing step.

Figure 10:
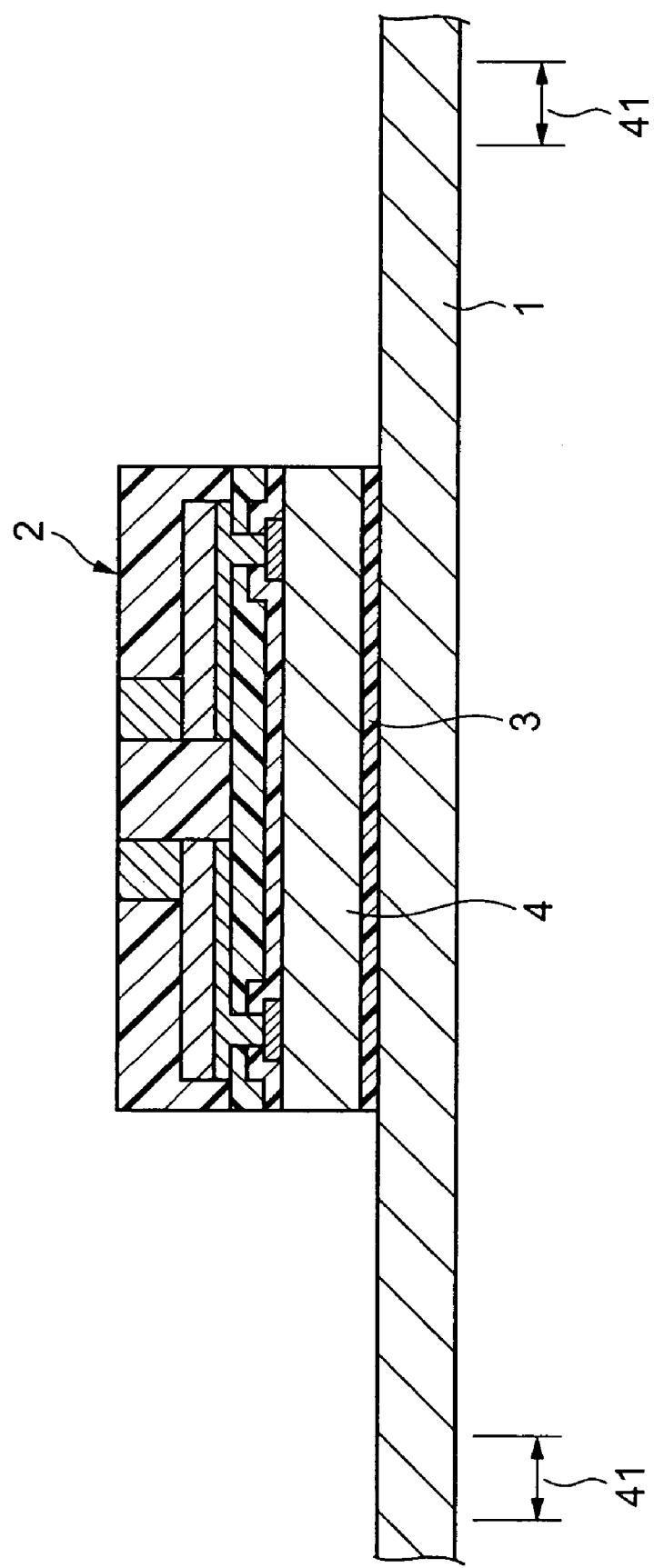
FIG. 10 is an enlarged cross sectional view for explaining a step succeeding FIG. 9.

Next, one example of fabrication of the semiconductor package shown in FIG. 1 which is formed by using the semiconductor structure 2 obtained in this manner will be explained. First, as shown in FIG. 10, a base plate 1 whose planar shape is rectangular and from which a plurality of unit base plates 1 can be obtained is prepared. The planar shape of the base plate 1 is not limited to the rectangular shape. Next, the adhesive layers 3 adhered to the lower surfaces of the silicon substrates 4 of the respective semiconductor structures 2 are adhered to a plurality of predetermined locations on the upper surface of the base plate 1. In this adhesion step, the adhesive layers 3 are fully hardened by hot pressing. In FIG. 10, the regions denoted by the reference numeral 41 are regions corresponding to a lattice-like dicing street.

Figure 11:
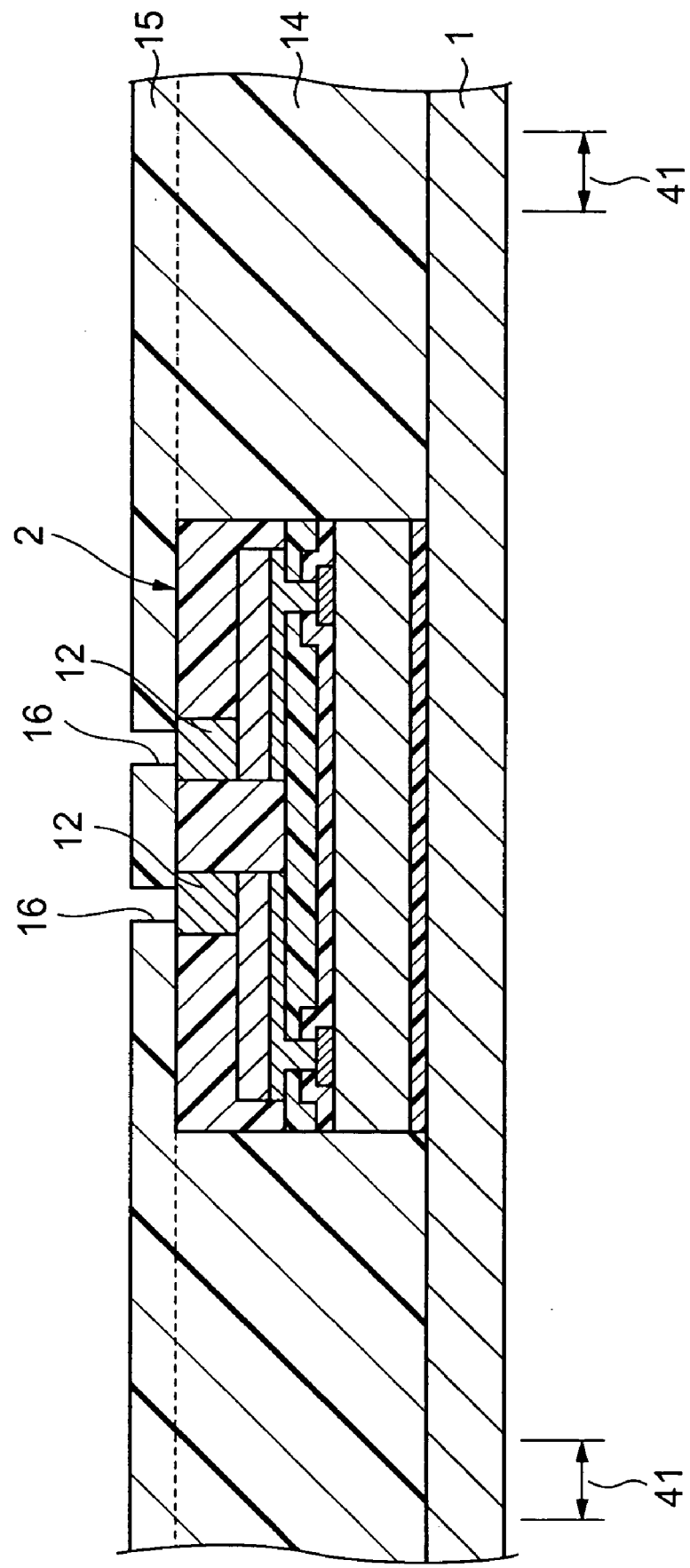
FIG. 11 is an enlarged cross sectional view for explaining a step succeeding FIG. 10.

Next, as shown in FIG. 11, an insulation layer 14 and a first upper insulation film 15 which are made of a photosensitive material such as epoxy resin, polyimide resin, or the like are simultaneously formed on the entire upper surface of the base plate 1 and the plurality of semiconductor structures 2 by a printing method, a molding method, or the like. In this state, the upper surface of the semiconductor structure 2 is covered with the first upper insulation film 15. Next, the upper surface of the first upper insulation film 15 is adequately polished as needed, to flatten the upper surface of the first upper insulation film 15. Subsequently, openings 16 are formed in the first upper insulation film 15 at locations corresponding to the pole electrodes 12 by photolithography or the like.

Figure 12:
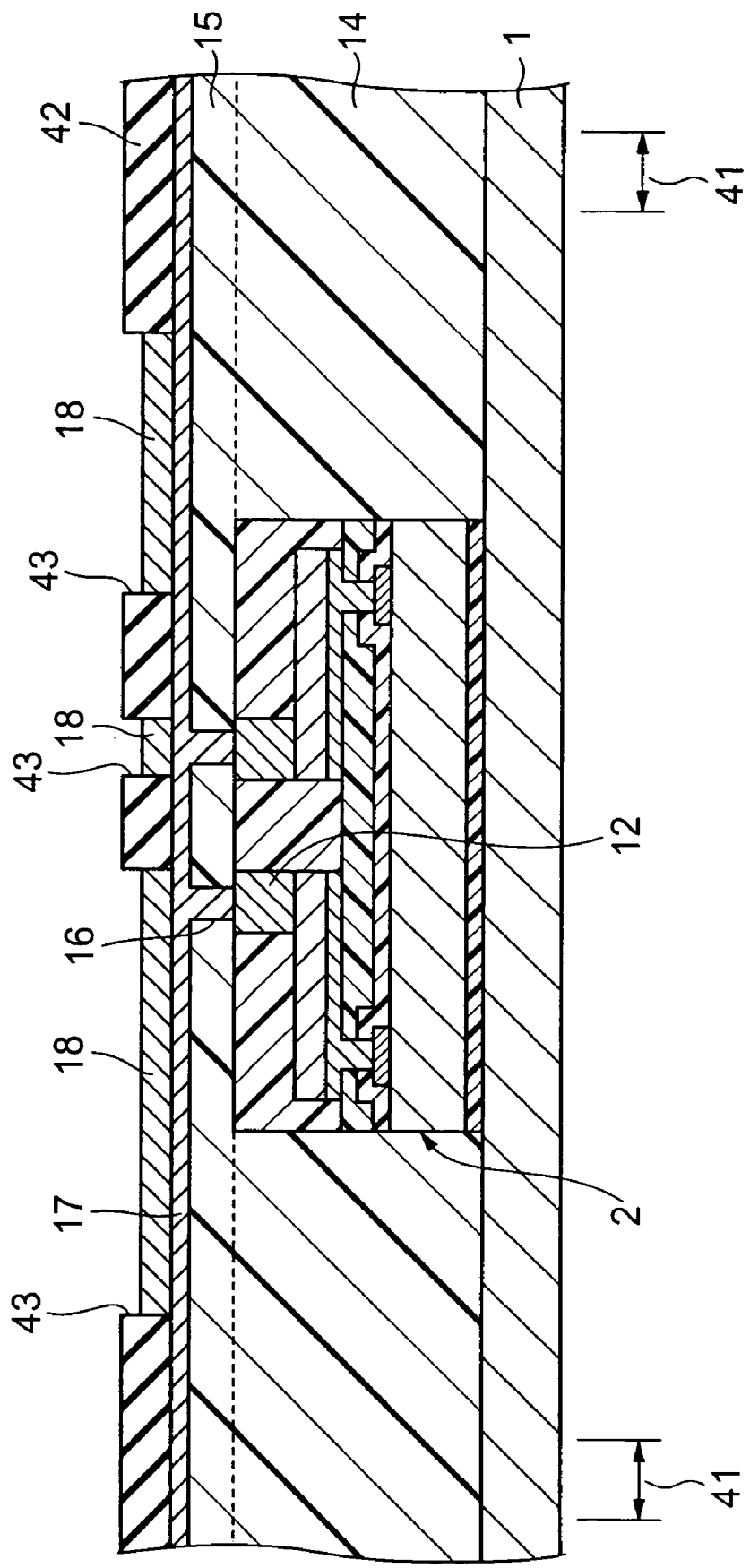
FIG. 12 is an enlarged cross sectional view for explaining a step succeeding FIG. 11.

Then, as shown in FIG. 12, a first upper base metal layer 17 is formed on the entire upper surface of the first upper insulation film 15 including the upper surfaces of the pole electrodes 12 exposed via the openings 16. Next, a resist film 42 for preventing a plate is formed to have a pattern on the upper surface of the first upper base metal layer 17. In this case, openings 43 are formed in the resist film 42 at locations corresponding to the regions where a first upper wiring 18 will be formed.

Figure 13:
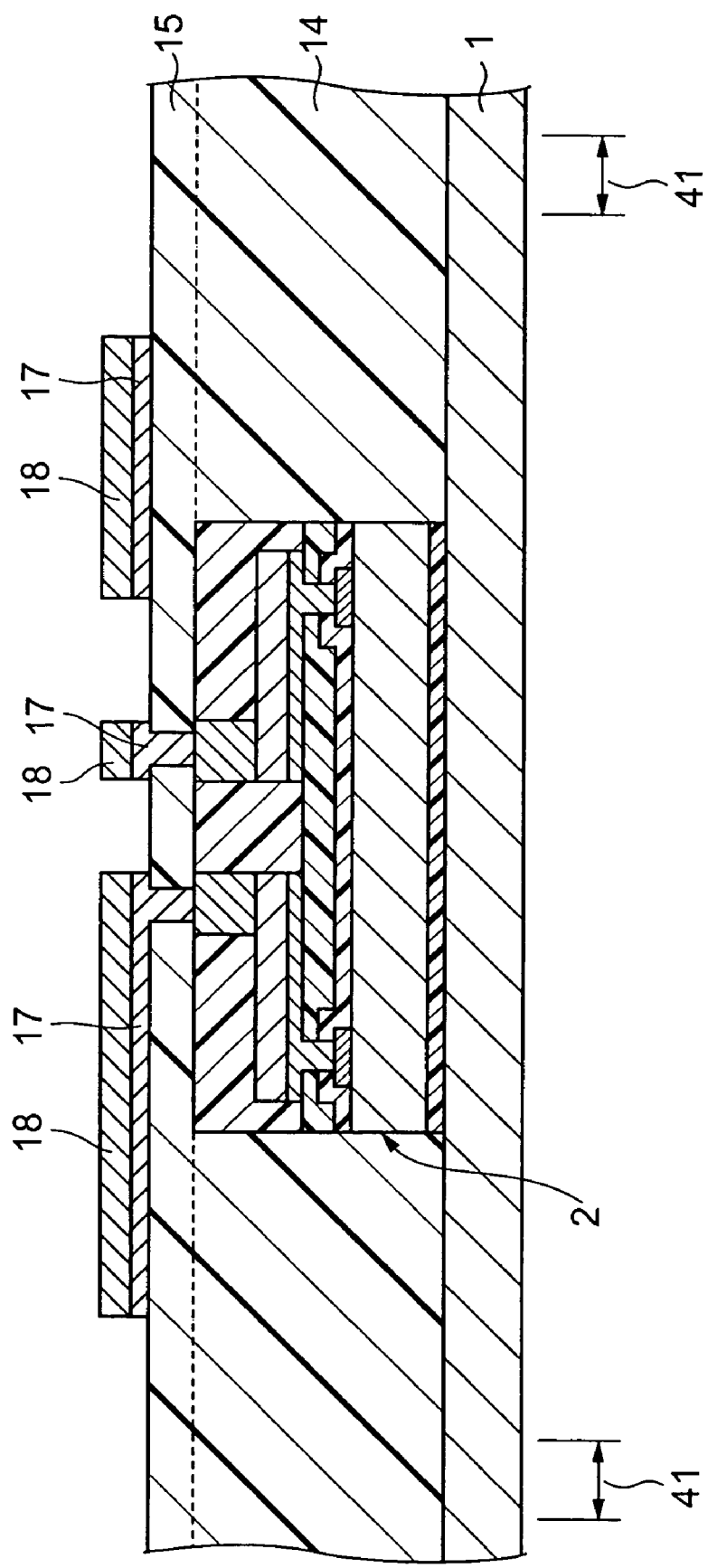
FIG. 13 is an enlarged cross sectional view for explaining a step succeeding FIG. 12.

Next, by applying electrolytic plating of copper, a first upper wiring 18 is formed on the upper surface of the first upper base metal layer 17 within the openings 43 of the resist film 42 through the first upper base metal layer 17 as the plating current path. Next, by peeling off the resist film 42 and removing unnecessary portions of the first upper base metal layer 17 by etching using the first upper wiring 18 as a mask, the first upper base metal layer 17 remains only beneath the first upper wiring 18, as shown in FIG. 13.

Figure 14:
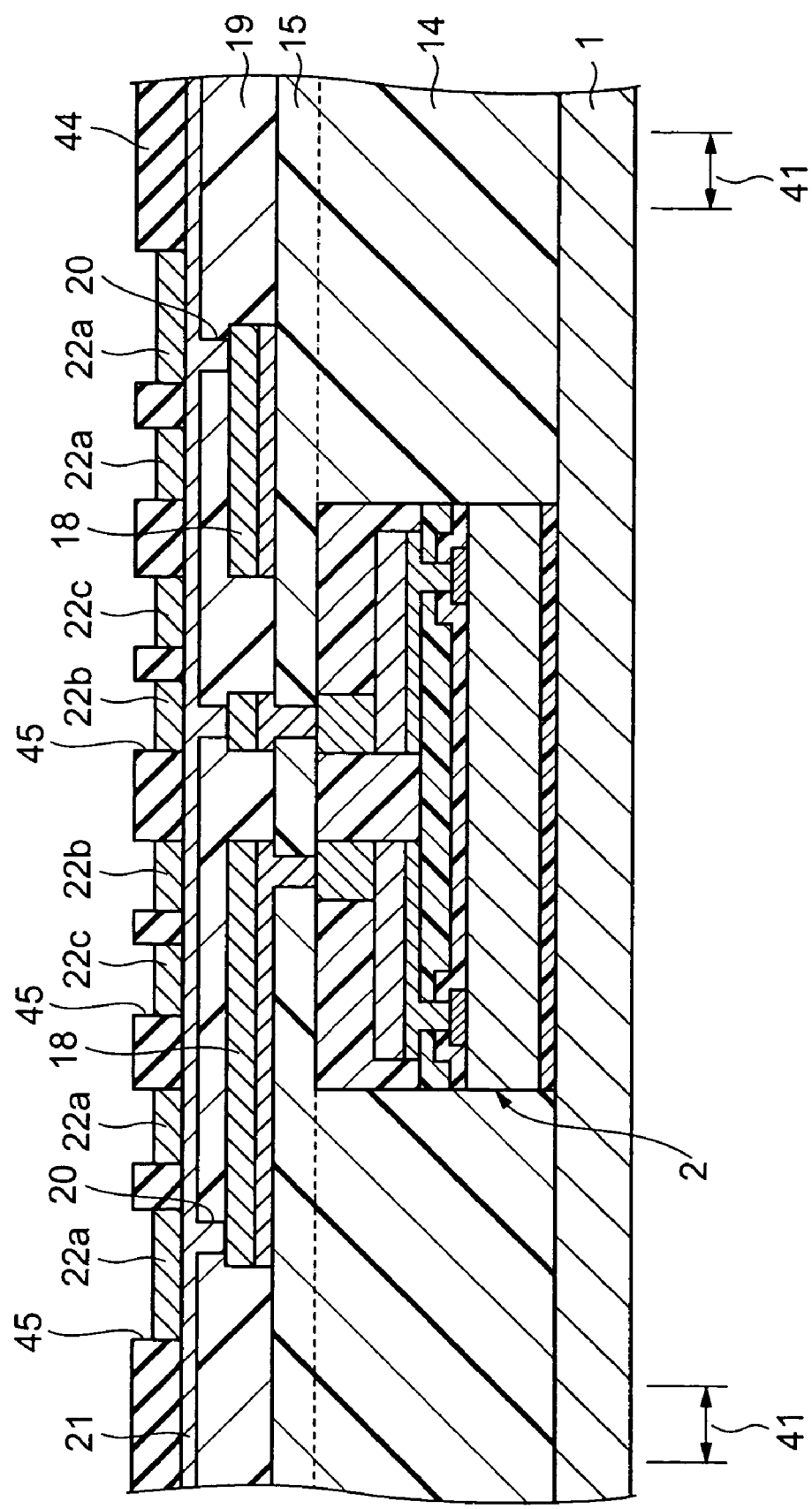
FIG. 14 is an enlarged cross sectional view for explaining a step succeeding FIG. 13.

Then, as shown in FIG. 14, a second upper insulation film 19 is formed to have a pattern, by coating a photosensitive polymeric material made of epoxy resin, polyimide resin, or the like on the entire upper surface of the first upper insulation film 15 including the first upper wiring 18 and then by adequately etching the coated polymeric material. In this case, openings 20 are formed in the second upper insulation film 19 at locations corresponding to the connection pad portions of the first upper wiring 18. Then, a second upper base metal layer 21 is formed on the entire upper surface of the second upper insulation film 19 including the connection pad portions of the first upper wiring 18 that are exposed via the openings 20.

Next, a resist film 44 for preventing a plate is formed to have a pattern on the upper surface of the second upper base metal layer 21. In this case, openings 45 are formed in the resist film 44 at locations corresponding to the regions where second upper wirings 22a and 22b, and dummy wirings 22c will be formed. Then, by applying electrolytic plating of copper, second upper wirings 22a and 22b, and dummy wirings 22c are formed on the upper surface of the second upper base metal layer 21 within the openings 45 of the resist film 44 through the second upper base metal layer 21 as the plating current path. After this, the resist film 44 is peeled off.

Figure 15:
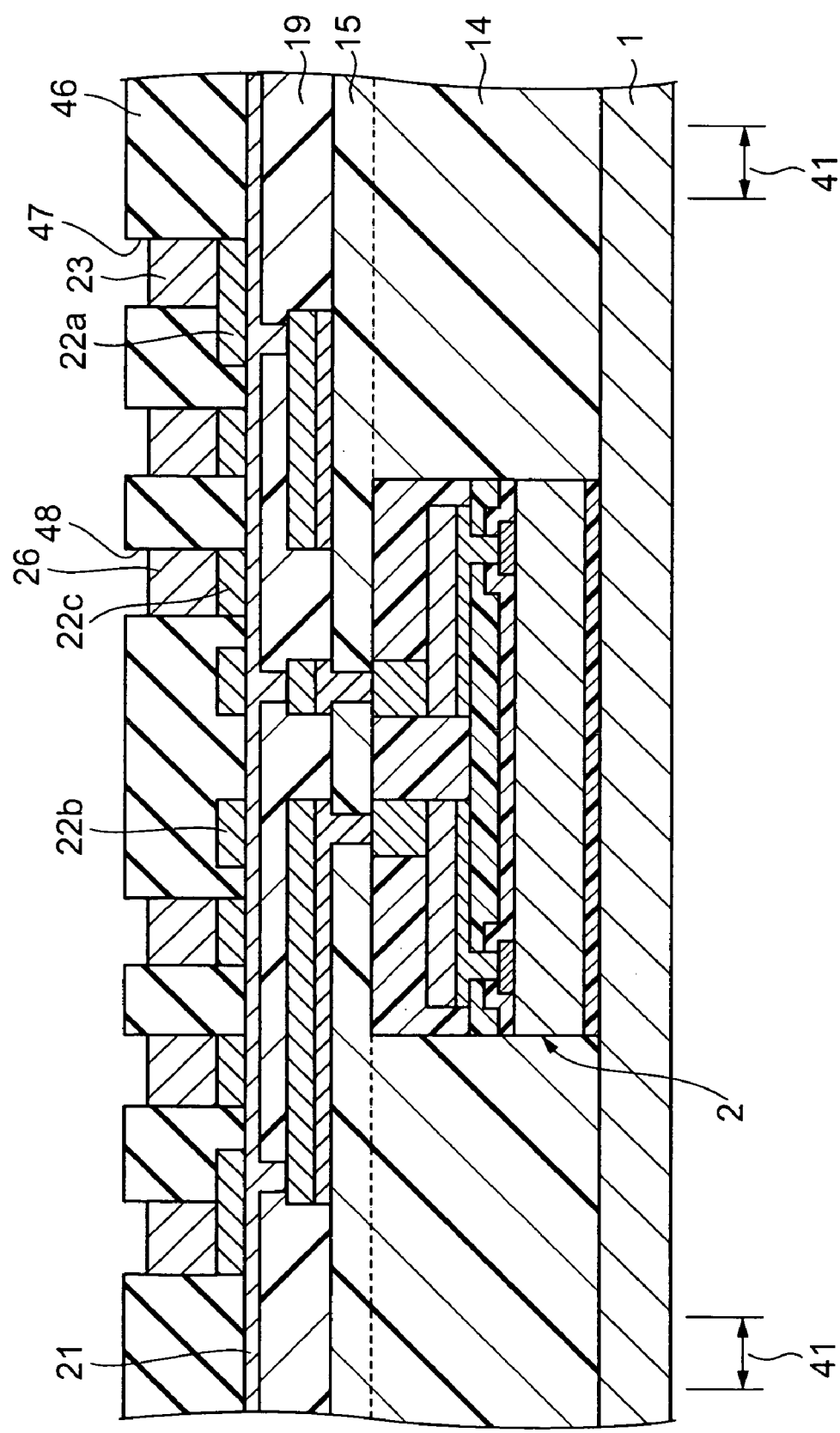
FIG. 15 is an enlarged cross sectional view for explaining a step succeeding FIG. 14.

Then, as shown in FIG. 15, a resist film 46 for preventing a plate is formed to have a pattern on the upper surface of the second upper base metal layer 21 and the second upper wirings 22a and 22b. In this case, openings 47 are formed in the resist film 46 at locations corresponding to the connection pad portions of the second upper wirings 22a. In addition, openings 48 are formed in the resist film 46 at locations corresponding to the insular dummy wirings 22c.

Next, by applying electrolytic plating of copper, lower pole electrodes 23 are formed on the upper surfaces of the connection pad portions of the second upper wirings 22a within the openings 47 of the resist film 46 through the second upper base metal layer 21 as the plating current path. Further, dummy pole electrodes 26 are formed on the upper surfaces of the insular dummy wirings 22c within the openings 48 of the resist film 46. Then, the resist film 46 is peeled off.

Figure 16:
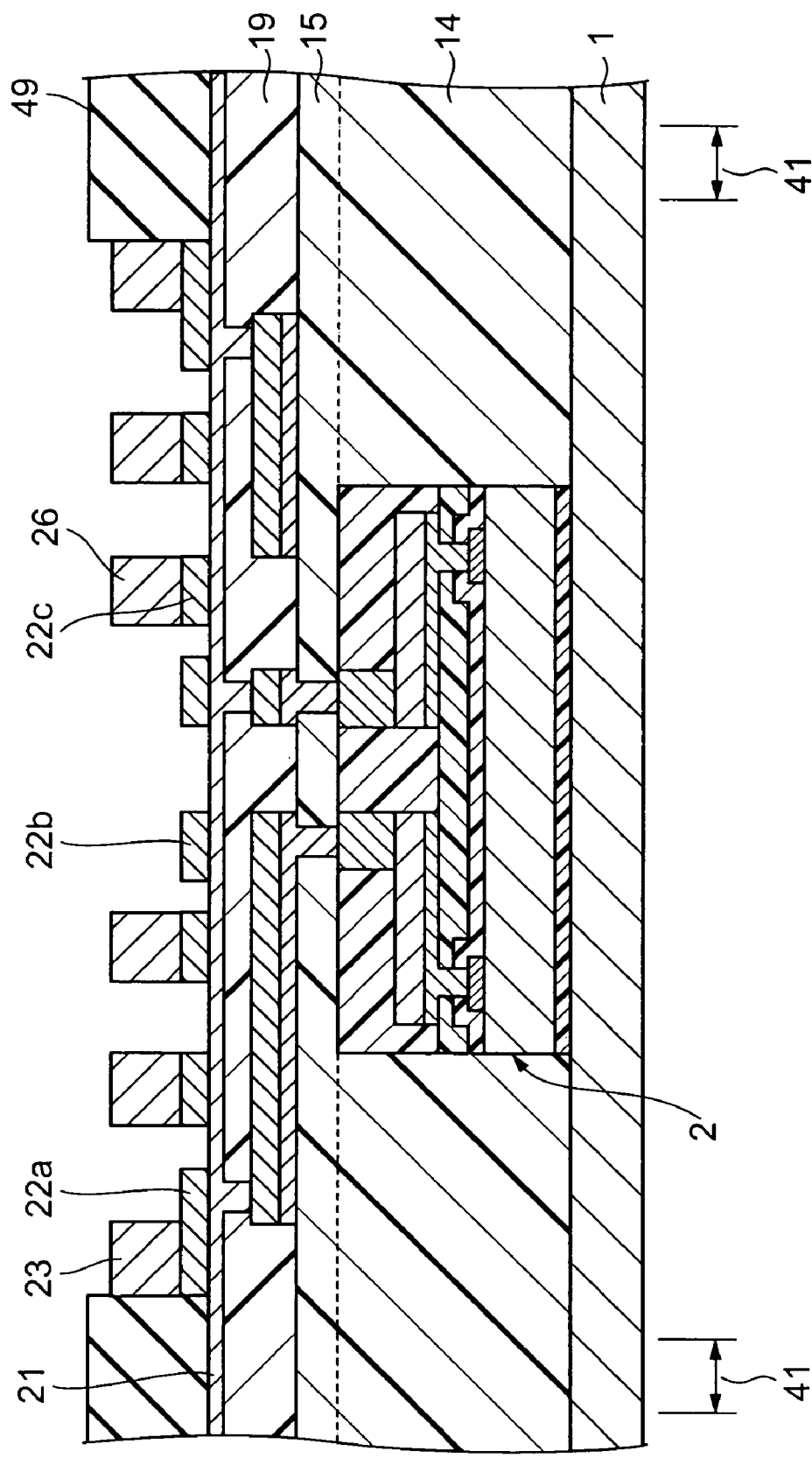
FIG. 16 is an enlarged cross sectional view for explaining a step succeeding FIG. 15.

Then, as shown in FIG. 16, a resist film 49 is formed to have a pattern on the upper surface of the second upper base metal layer 21. In this case, the resist film 49 comprises a pattern including a portion formed like a lattice on the widthwise center of a region overlapping the lattice-like dicing street 41, and a portion formed continuously with this lattice-like portion on a region where the connector base metal layers 21d shown in FIG. 1 will be formed.

Figure 17:
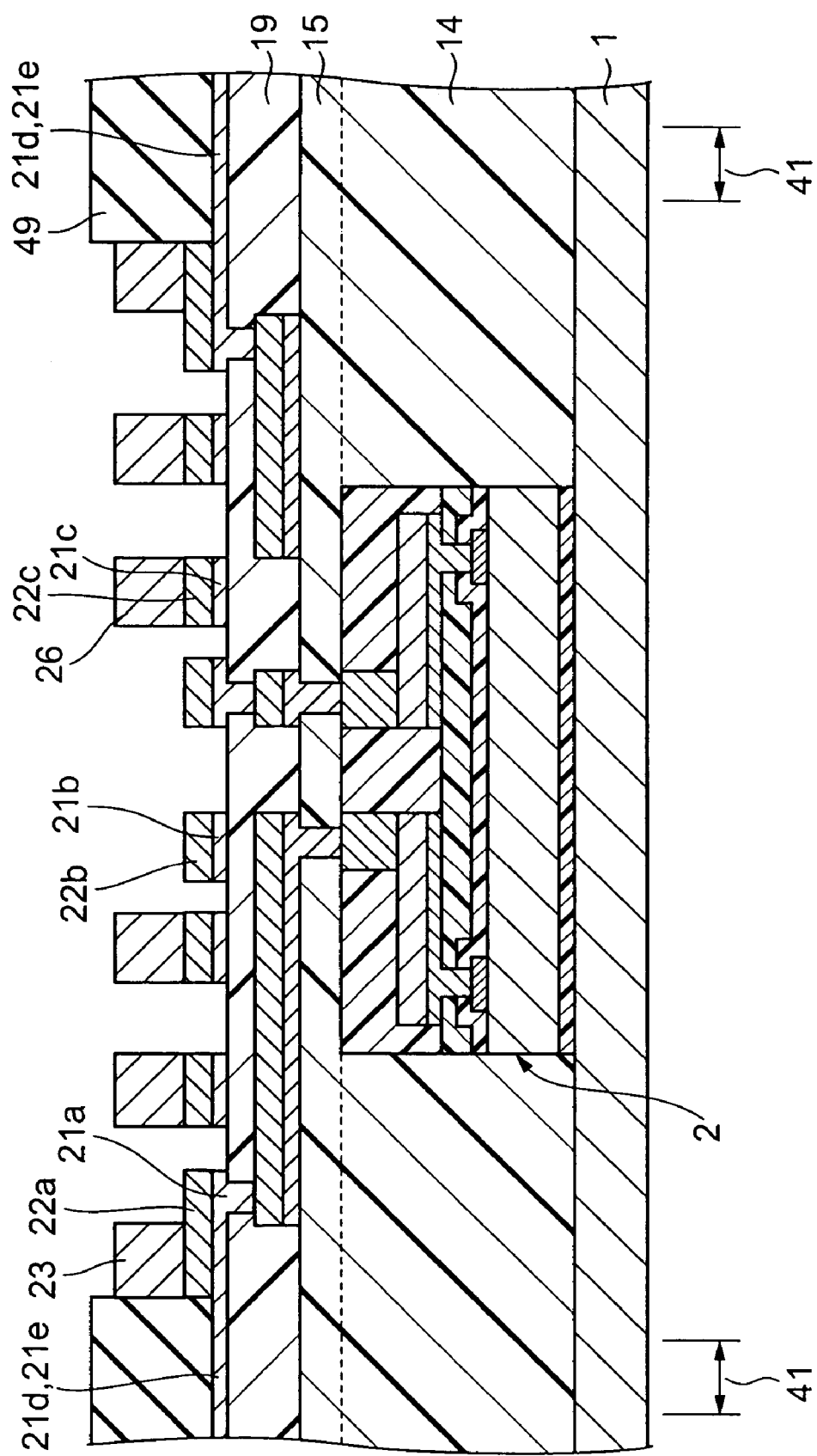
FIG. 17 is an enlarged cross sectional view for explaining a step succeeding FIG. 16.

Next, unnecessary portions of the second upper base metal layer 21 are removed by etching using the resist film 49, the second upper wirings 22a including the lower pole electrodes 23, the second upper wirings 22b, and the dummy wirings 22c including the dummy pole electrodes 26 as masks. After the removal by etching, second upper base metal layers 21a and 21b remain only beneath the second upper wirings 22a and 22b, as shown in FIG. 17. In addition, dummy base metal layers 21c remain only beneath the dummy wirings 22c. Further, lattice-like plating current path base metal layers 21e and connector base metal layers 21d connected with the layers 21e remain beneath the f 49. In this case, the connector base metal layers 21d are connected to the second upper base metal layers 21a. Afterwards, the resist film 49 is peeled off.

Figure 18:
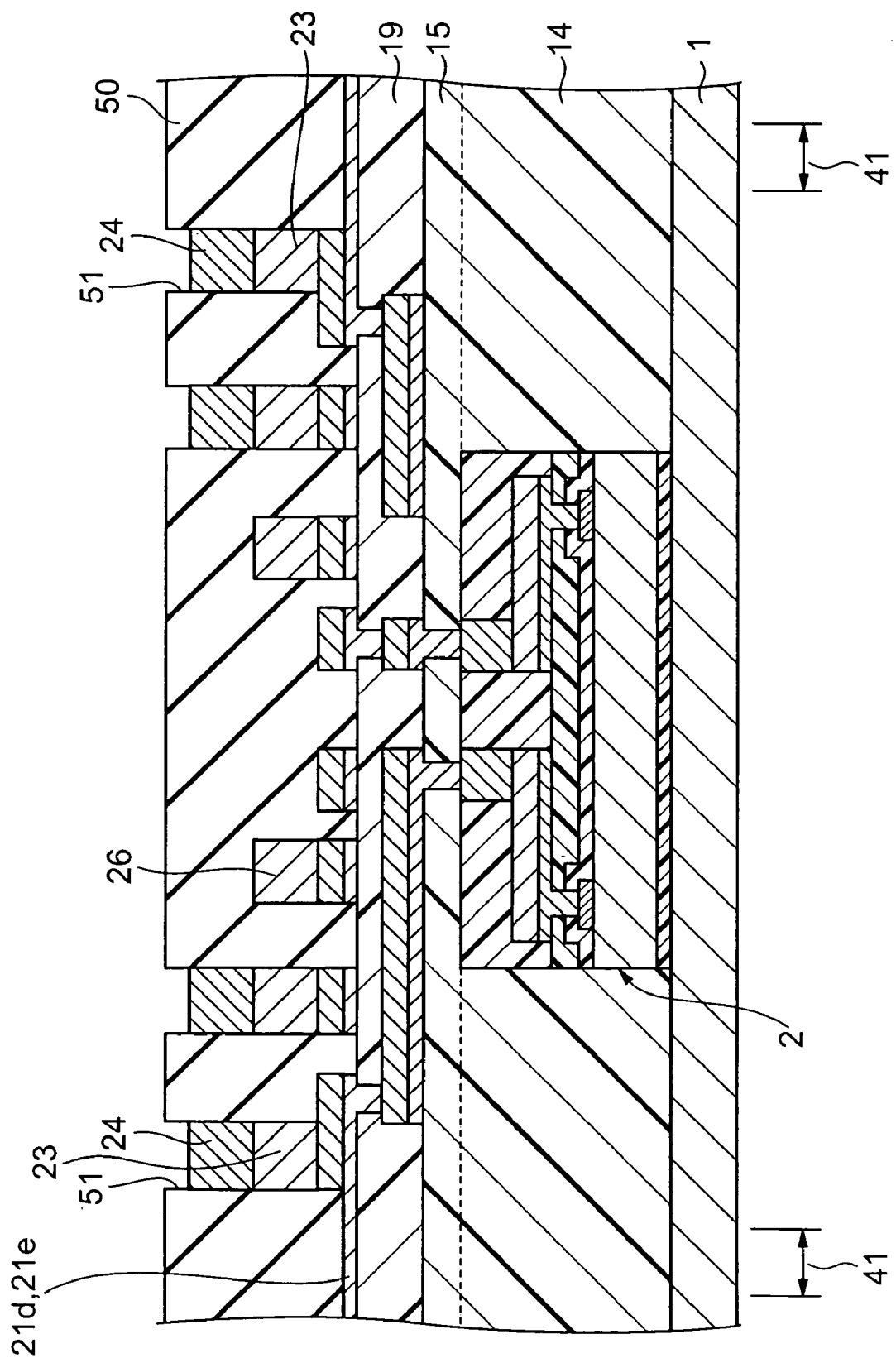
FIG. 18 is an enlarged cross sectional view for explaining a step succeeding FIG. 17.

Next, as shown in FIG. 18, a resist film 50 for preventing a plate is formed to have a pattern on the upper surface of the second upper insulation film 19 and the dummy pole electrodes 26, etc. In this case, openings 51 are formed in the resist film 50 at locations corresponding to the lower pole electrodes 23. Then, by applying electrolytic plating of copper, upper pole electrodes 24 are formed on the upper surfaces of the lower pole electrodes 23 within the openings 51 of the resist film 50 through the plating current path base metal layers 21e and the connector base metal layers 21d connected with the layers 21e as the plating current path. Then, the resist film 50 is peeled off.

Figure 19:
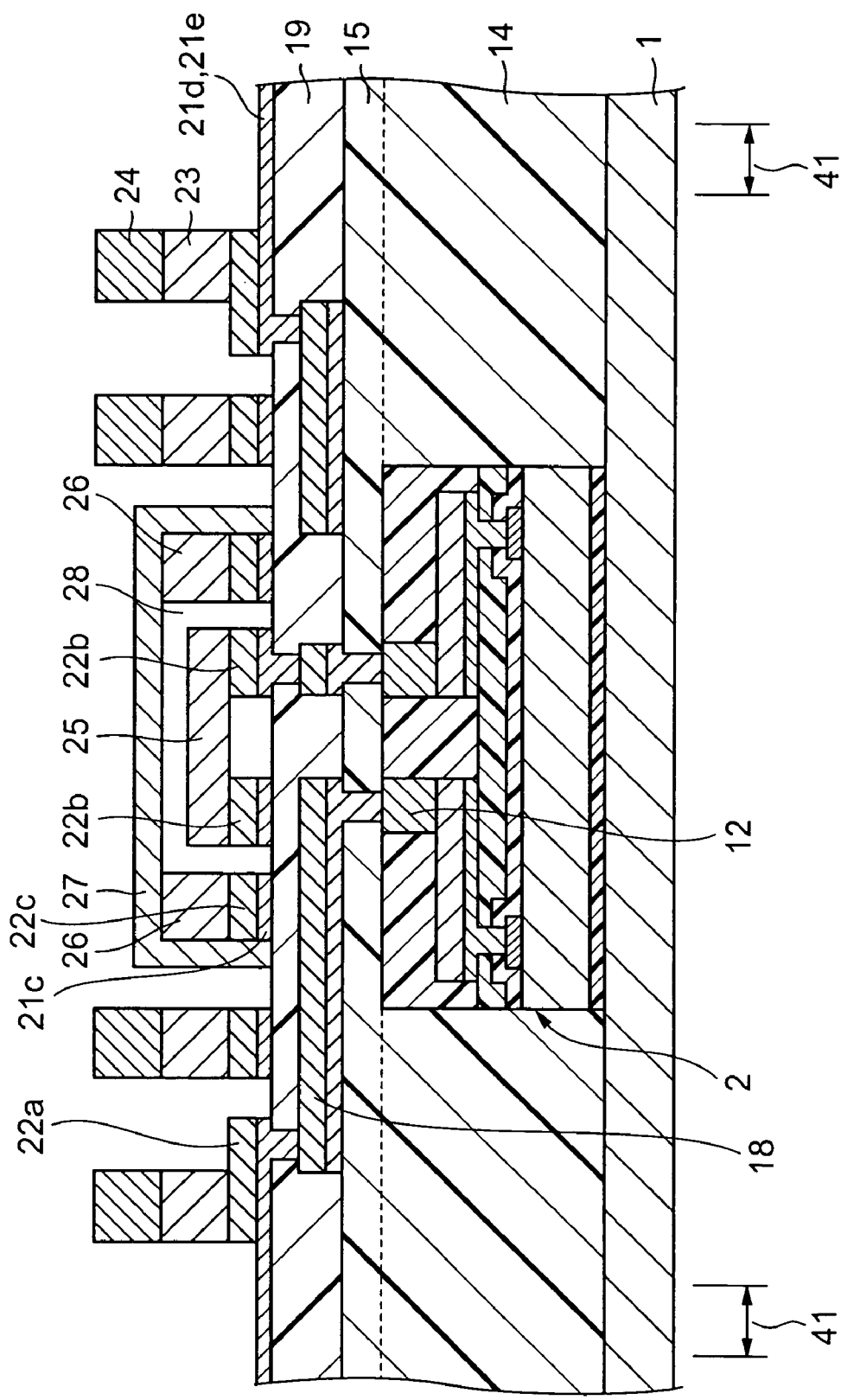
FIG. 19 is an enlarged cross sectional view for explaining a step succeeding FIG. 18.

Then, as shown in FIG. 19, electrodes of an MEMS component 25 constituted by an acceleration sensor or the like are connected onto the connection pad portions of the second upper wirings 22b by solder (not illustrated). Next, a rectangular cylindrical protection cover 27 that is capped at one end and made of resin, metal, or the like is arranged by being positioned along the outer sides of the dummy wirings 22c and dummy base metal layers 21c, and along the outer sides and upper surfaces of the dummy pole electrodes 26. In this state, a space 28 for allowing the MEMS component 25 to be driven is formed between the protection cover 27 and the MEMS component 25.

The second upper wirings 22b may be connected to the pole electrodes 12 in the semiconductor structure 2 via the first upper wiring 18. The second upper wirings 22b may be directly connected to the second upper wirings 22a. Furthermore, the second upper wirings 22b may be connected to the second upper wirings 22a via the dummy wirings 22c. In a case where the second upper wirings 22b are connected to the second upper wirings 22a, a protection cover 27 made of an insulation material may be formed as needed.

Figure 20:
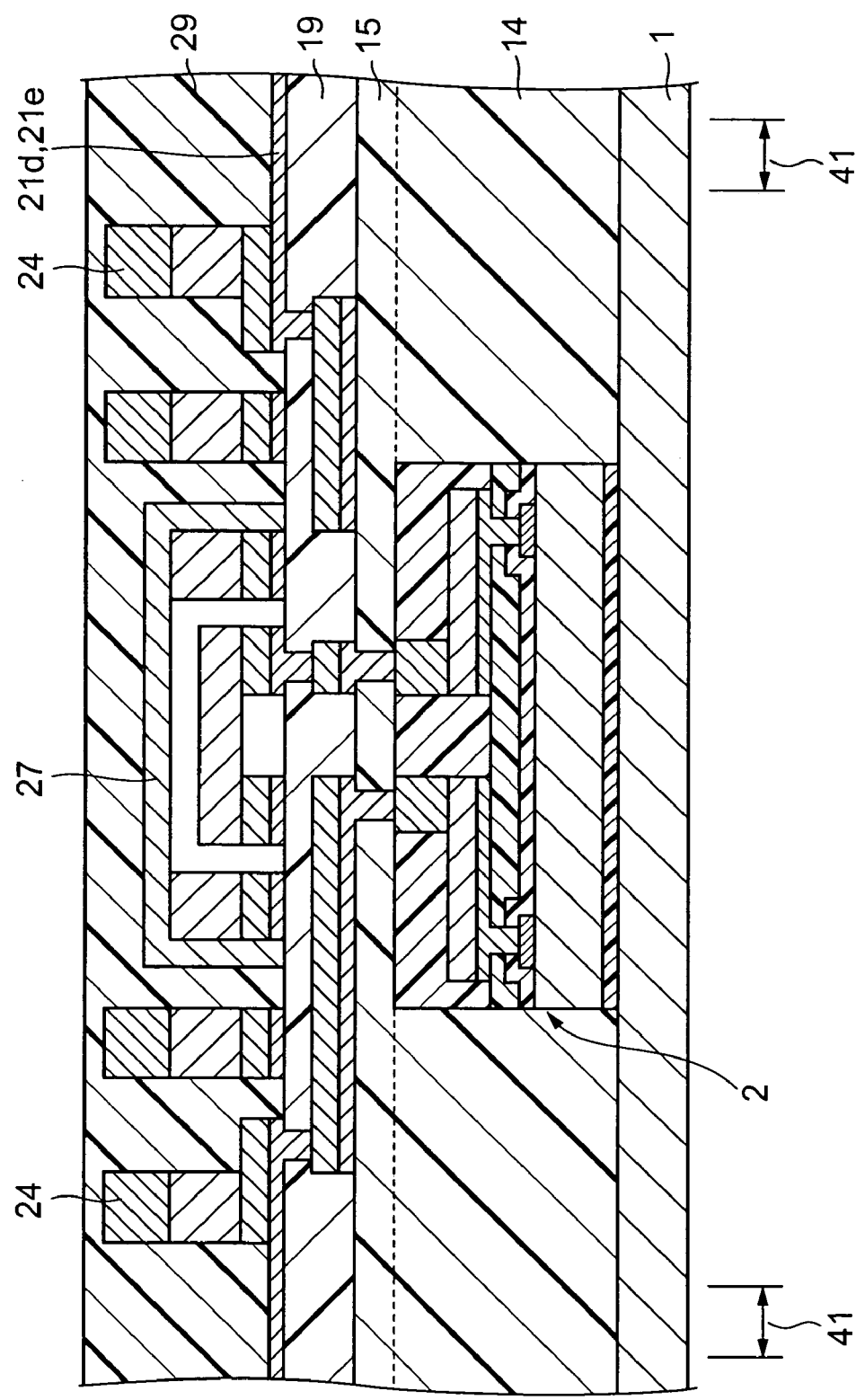
FIG. 20 is an enlarged cross sectional view for explaining a step succeeding FIG. 19.

Next, as shown in FIG. 20, a third upper insulation film 29 made of epoxy resin, polyimide resin, or the like is formed by a printing method, a molding method, or the like upon the entire upper surface of the second upper insulation film 19 including the upper pole electrodes 24, the protection cover 27, the connector base metal layers 21d, the plating current path base metal layers 21e, etc. The third upper insulation film 29 is formed to have a thickness larger than the height of the upper pole electrodes 24. Therefore, in this state, the upper surfaces of the upper pole electrodes 24 are covered with the third upper insulation film 29.

Figure 21:
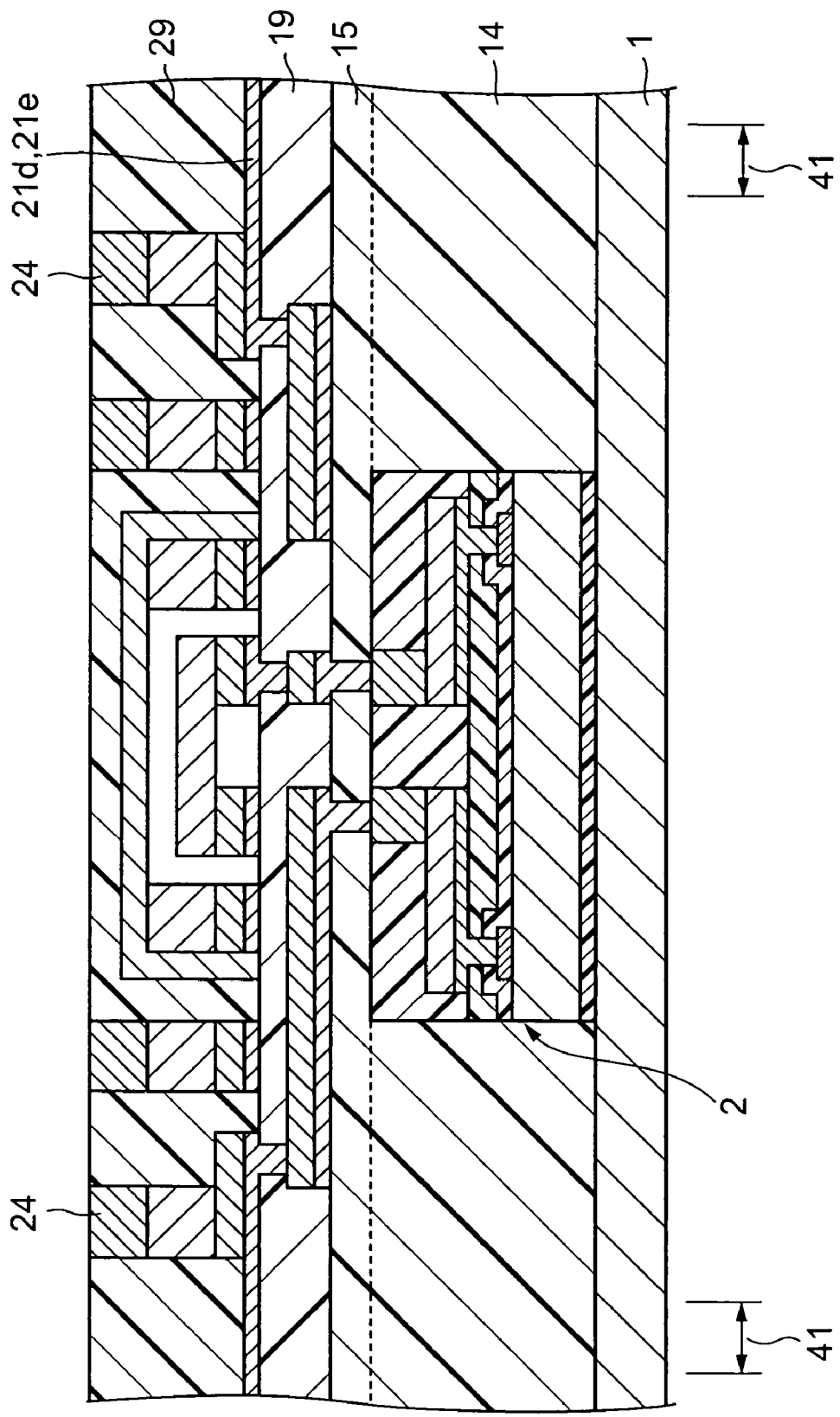
FIG. 21 is an enlarged cross sectional view for explaining a step succeeding FIG. 20.
Figure 22:
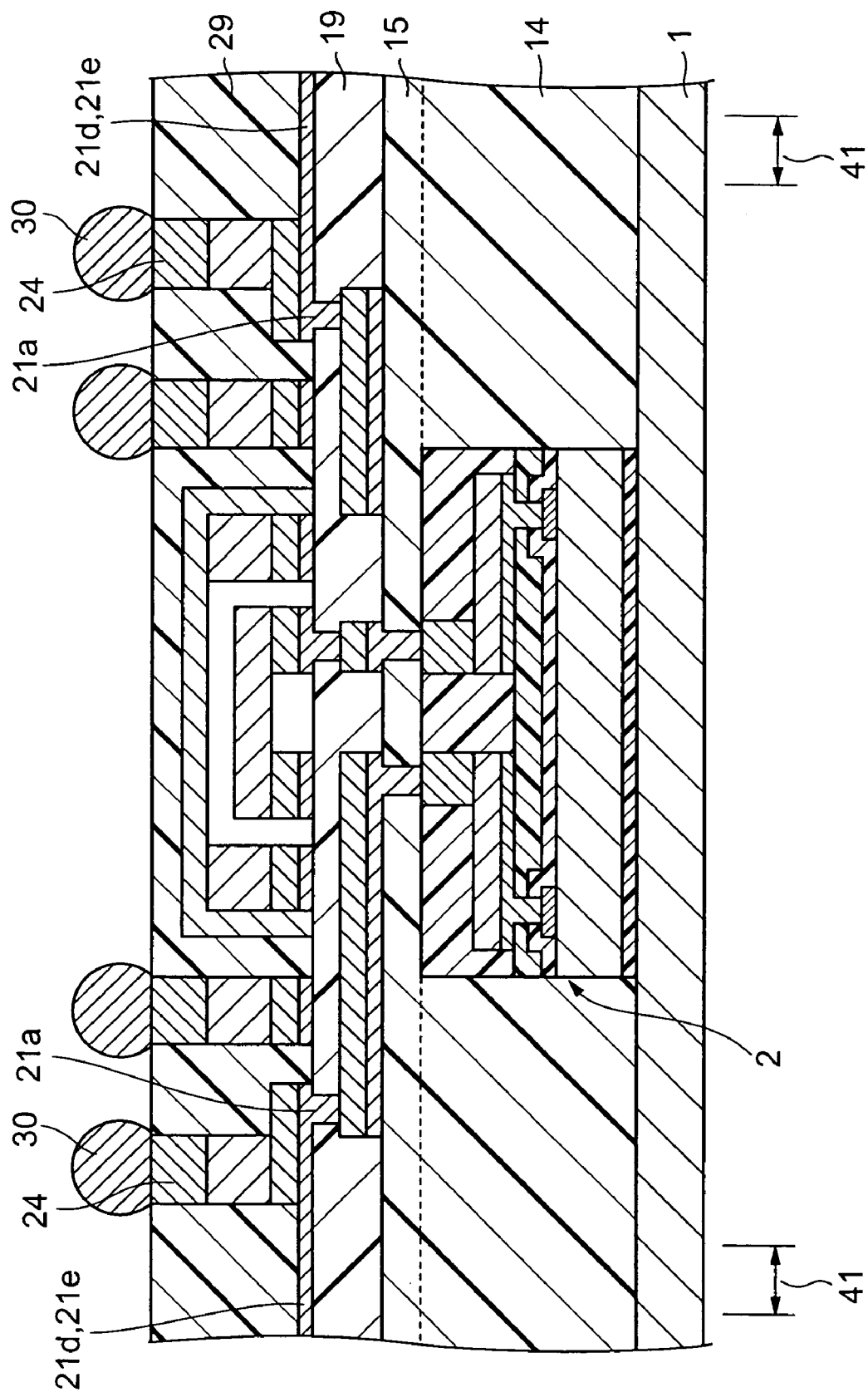
FIG. 22 is an enlarged cross sectional view for explaining a step succeeding FIG. 21.

Then, the upper surfaces of the third upper insulation film 29 and upper pole electrodes 24 are adequately polished to expose the upper surfaces of the upper pole electrodes 24 as shown in FIG. 21. Simultaneously, the upper surface of the third upper insulation film 29 including the exposed upper surfaces of the upper pole electrodes 24 is flattened. Next, as shown in FIG. 22, solder balls 30 are formed on the upper surfaces of the upper pole electrodes 24. Then, the third upper insulation film 29, the second upper insulation film 19, the first upper insulation film 15, the insulation layer 14, and the base plate 1 are diced along the dicing street 41, thereby to obtain a plurality of semiconductor packages 1 shown in FIG. 1. In this case, since the plating current path base metal layers 21e formed above the dicing street 41 are removed, the second upper base metal layers 21a are non-short-circuited with each other.

In FIG. 1, the lower pole electrode 23 and the upper pole electrode 24 are divided by a solid line drawn between them for illustrative convenience. However, since actually the lower pole electrode 23 and the upper pole electrode 24 are formed by electrolytic plating of copper, there is no interface between the lower and upper pole electrodes 23 and 24 that divides them from each other. Accordingly, the lower pole electrode 23 and the upper pole electrode 24 integrally form one pole electrode.

(Second Embodiment)

Figure 23:
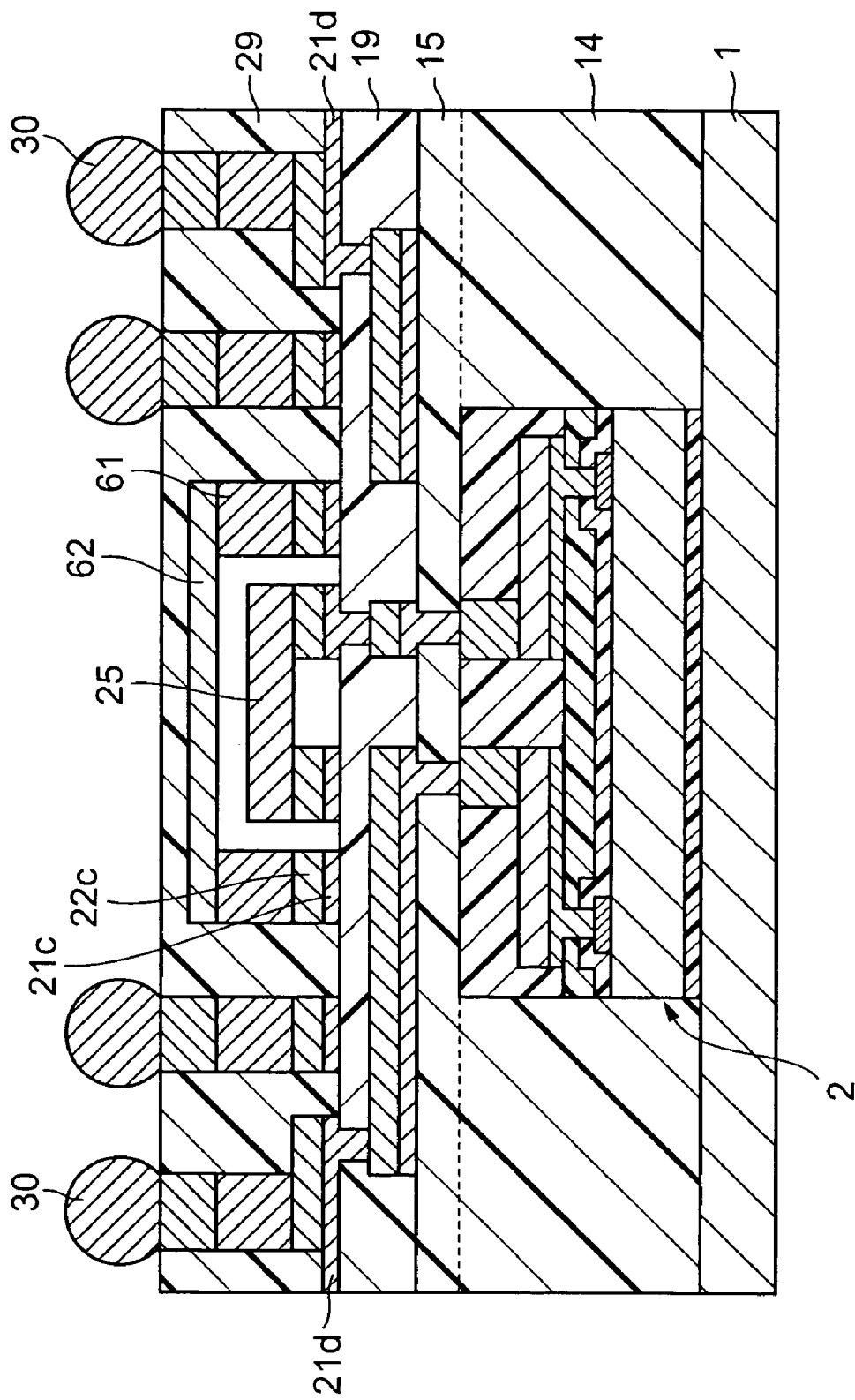
FIG. 23 is an enlarged cross sectional view of a semiconductor package as a second embodiment of the present invention.

In the above-described first embodiment, a rectangular cylindrical cover that is capped at one end is used as the protection cover 27, and this protection cover 27 is arranged by being positioned based on the dummy pole electrodes 26, as has been explained above. However, the manner of arranging the protection cover 27 is not limited to this. For example, as the second embodiment of the present invention shown in FIG. 23, a frame-like side wall 61 may be formed by electrolytic plating of copper upon the dummy base metal layers 21c and dummy wirings 22c which are formed like a rectangular frame around the region where the planar rectangular MEMS components 25 is formed, and a flat plate 62 made of resin, metal, or the like may be adhered onto the frame-like side wall 61.

(Third Embodiment)

Figure 24:
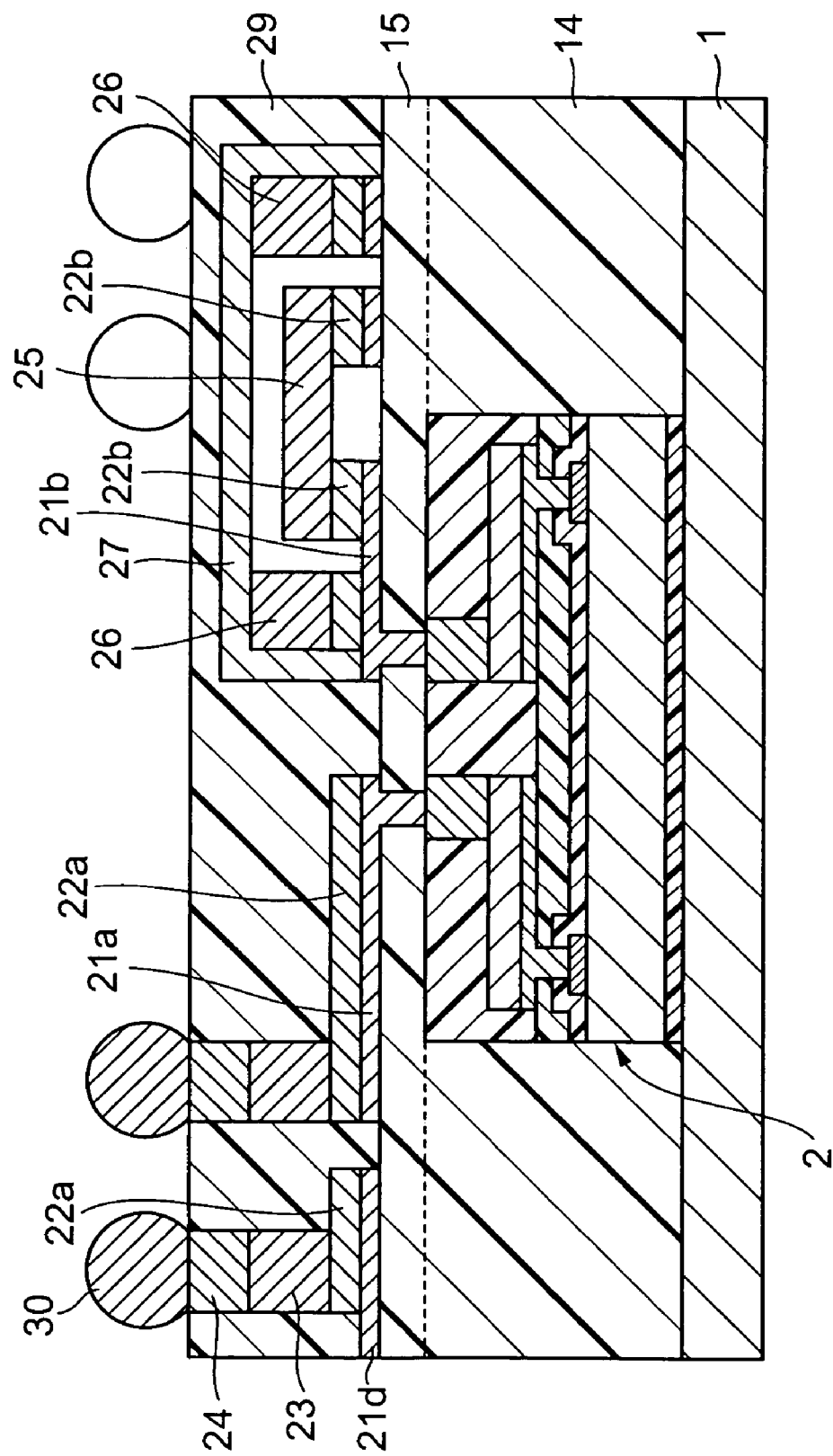
FIG. 24 is an enlarged cross sectional view of a semiconductor package as a third embodiment of the present invention.

In the above-described first embodiment, a case where the upper wiring includes two layers has been explained. However, the present invention is not limited to this, but the upper wiring may include three or more layers. Further, as the third embodiment of the present invention shown in FIG. 24, the upper wiring may include a single layer. The major difference between the third embodiment and the first embodiment shown in FIG. 1 is that in the third embodiment, the first upper base metal layer 17, the first upper wiring 18, and the second upper insulation film 19 shown in FIG. 1 are omitted. In this case, in order to secure routing areas for the upper wirings 21a and 21b upon the first upper insulation film 15 on the semiconductor structure 2, the MEMS component 25 is positioned biasedly to one side of the first upper insulation film 15.

(Other Embodiments)

In the above-described embodiments, the MEMS component 25 and the protection cover 27 are separate members. However, the protection cover 27 may be formed integrally with the MEMS component 25. In this case, if there is a need of providing a space between the MEMS component 25 and the protection cover 27, the both may be coupled to each other by providing a spacer interveningly between them. As a spacer, a frame-like sheet member having an opening in the center thereof, or multiple minute particles may be used.

In the above-described embodiments, the semiconductor structure 2 includes the pole electrodes 12 provided on the connection pad portions of the wirings 11, as electrodes for external connection. However, the present invention is not limited to this construction. For example, the semiconductor structure 2 may be one that includes wirings 11 having connection pad portions which act as electrodes for external connection. Further, the semiconductor structure 2 may be one that includes the connection pads 5 which act as electrodes for external connection, or may be one that includes pole electrodes which are provided on the connection pads 5 to act as electrodes for external connection. The base plate 1 may be separated in order to make the semiconductor package much thinner, and a metal plate may be attached to where the base plate 1 has been separated, to prevent static electricity or to facilitate heat liberation. The base plate 1 may be diced such that each unit base plate 1 has a plurality of semiconductor structures 2 thereon. The semiconductor structure 2 may be mounted on the base plate 1 in a face-down fashion. As described above, the present invention can be utilized by adequately modifying it within the scope of the meaning of the present invention.

As described above, according to these embodiments, since the MEMS component is covered with a protection cover in such a manner as to allow the MEMS component to be driven, and since the vicinities of the pole electrodes and at least the vicinity of the protection cover are covered with an upper insulation film, it is possible to mount the MEMS component drivably and to miniaturize the semiconductor package as a whole.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2003-186961 filed on Jun. 30, 2003 and including specification, claims, drawings and summary. The disclosure of the above Japanese Patent Application is incorporated herein by reference in its entirety.

What is claimed is:

1. A semiconductor package comprising:
   a semiconductor structure comprising: (a) a semiconductor substrate including an integrated circuit provided thereon and a plurality of connection pads that are each electrically connected to the integrated circuit, and (b)

a plurality of electrodes for external connection which are provided on the semiconductor substrate;

an insulation layer provided around the semiconductor structure;

a first upper insulation film provided on the semiconductor structure and the insulation layer;

an upper wiring which includes connection pad portions and is provided on the first upper insulation film such that at least a part of the upper wiring is connected to the electrodes for external connection of the semiconductor structure;

a micro electric mechanical system electrically connected to at least one of the connection pad portions of the upper wiring;

a protection cover arranged to cover the micro electric mechanical system;

pole electrodes electrically connected to others of the connection pad potions of the upper wiring; and a second upper insulation film covering vicinities of the pole electrodes, and at least a vicinity of the micro electric mechanical system.

2. The semiconductor package according to claim 1, wherein the protection cover comprises a frame-like side wall and a flat plate provided on the frame-like side wall.

3. The semiconductor package according to claim 2, wherein the frame-like side wall is formed on a same plane as the pole electrodes by using a same material as the pole electrodes.

4. The semiconductor package according to claim 1, wherein upper surfaces of the pole electrodes are higher than an upper surface of the protection cover.

5. The semiconductor package according to claim 4, wherein the upper surface of the protection cover as covered with the second upper insulation film and an upper surface of the second upper insulation film is level with the upper surfaces of the pole electrodes.

6. The semiconductor package according to claim 1, wherein the electrodes for external connection of the semiconductor structure comprise pole electrodes.

7. The semiconductor package according to claim 1, wherein the electrodes for external connection of the semiconductor structure comprise wirings including connection pad portions.

8. A semiconductor package comprising:

a semiconductor structure including a plurality of electrodes for external connection which are provided on a semiconductor substrate;

an insulation layer provided on the semiconductor structure;

an upper wiring which includes connection pad portions and is provided on the insulation lava such that at least a part of the upper wiring is connected to the electrodes for external connection of the semiconductor structure;

a micro electric mechanical system electrically connected to at least one of the connection pad portions of the upper wiring;

a protection cover arranged to cover the micro electric mechanical system;

pole electrodes electrically connected to others of the connection pad potions of the upper wiring; and an upper insulation film covering vicinities of the pole electrodes, and at least a vicinity of the micro electric mechanical system:

wherein the protection cover is cylindrical and capped at one end.

9. The semiconductor package according to claim 8, further comprising dummy pole electrodes for positioning the protection cover, which are provided on a same plane as the pole electrodes.

10. The semiconductor package according to claim 8, wherein the semiconductor structure comprises connection pads for external connection.

11. A semiconductor package comprising:

a semiconductor structure including a plurality of electrodes for external connection which are provided on a semiconductor substrate;

an insulation layer provided on the semiconductor structure;

an upper wiring which includes connection pad portions and is provided on the insulation layer such that at least a part of the upper wiring is connected to the electrodes for external connection of the semiconductor structure;

a micro electric mechanical system electrically connected to at least one of the connection pad portions of the upper wiring;

pole electrodes electrically connected to others of the connection pad potions of the upper wiring;

solder balls provided on the pole electrodes; and an upper insulation film covering vicinities of the pole electrodes, and at least a vicinity of the micro electric mechanical system.

12. A manufacturing method for a semiconductor package, comprising:

arranging apart from each other on a base plate a plurality of semiconductor structures each comprising: (a) a semiconductor substrate including an integrated circuit provided thereon and a plurality of connection pads that are each electrically connected to the integrated circuit, and (b) a plurality of electrodes for external connection which are provided on a semiconductor substrate;

forming an insulation layer around the semiconductor structures on the base plate;

forming a first upper insulation film on the semiconductor structures and the insulation layer;

forming an upper wiring, which includes connection pad portions, on the first upper insulation film, such that at least parts of the upper wiring are connected to the electrodes for external connection of the semiconductor structures;

arranging a respective micro electric mechanical system at a plurality of the semiconductor structures, said micro electric mechanical system being electrically connected to at least one of the connection pad portions of the upper wiring;

providing a protection cover to cover each said micro electric mechanical system;

forming pole electrodes which are electrically connected to others of the connection pad portions of the upper wiring;

covering vicinities of the pole electrodes and at least a vicinity of each said micro electric mechanical system with a second upper insulation film; and obtaining a plurality of semiconductor packages each including at least one said micro electric mechanical system by dividing the first and second upper insulation films, the insulation layer, and the base plate between the semiconductor structures.

13. The manufacturing method for a semiconductor package according to claim 12, wherein each of the pole electrodes comprises a lower pole electrode and an upper pole electrode which are formed by respective separate electrolytic plating processes.

14. The manufacturing method for a semiconductor package according to claim 13, wherein the protection cover is cylindrical and capped at one end, and the method further comprises forming dummy pole electrodes for positioning the protection cover simultaneously with formation of the lower pole electrodes.

15. The manufacturing method for a semiconductor package according to claim 13, wherein the protection cover comprises a frame-like side wall and a flat plate provided on the frame-like side wall, and the frame-like wide wall is formed simultaneously with formation of the lower pole electrodes.

16. The manufacturing method for a semiconductor package according to claim 12, wherein the pole electrodes are formed such that upper surfaces thereof are higher than an upper surface of the protection cover.

17. The manufacturing method for a semiconductor package according to claim 16, wherein the second upper insulation film is initially formed so as to cover the upper surfaces of the pole electrodes and the upper surface of the protection cover, and then the upper surfaces of the pole electrodes are exposed by polishing an upper surface of the second upper insulation film.

18. The manufacturing method for a semiconductor package according to claim 12, further comprising forming solder balls on the pole electrodes.

19. The manufacturing method for a semiconductor package according to claim 12, wherein the electrodes for external connection of the semiconductor substrates comprise pole electrodes.

20. The manufacturing method for a semiconductor package according to claim 12, wherein the electrodes for external connection of the semiconductor substrates comprise wirings having connection pad portions.

* * * * *